US012751150B2

(12) United States Patent
Kwon

(10) Patent No.: US 12,751,150 B2
(45) Date of Patent: Sep. 29, 2026

(54) DISPLAY DEVICE

(71) Applicant: LG Display Co., Ltd., Seoul (KR)

(72) Inventor: Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 377 days.

(21) Appl. No.: 18/451,027

(22) Filed: Aug. 16, 2023

(65) Prior Publication Data

US 2024/0065041 A1 Feb. 22, 2024

(30) Foreign Application Priority Data

Aug. 18, 2022 (KR) ........................ 10-2022-0103431

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/8722* (2023.02)

(58) Field of Classification Search
CPC ............. H10K 59/121; H10K 59/8722; H10K 59/1201
See application file for complete search history.

(56) References Cited

U.S. PATENT DOCUMENTS 8,766,241 B2 * 7/2014 Yamazaki ............ H10K 59/122 438/23
2006/0033429 A1 * 2/2006 Fujimura ........... H10K 59/8722 313/506
2015/0349293 A1 * 12/2015 Park ....................... H10K 59/87 257/40
2017/0324065 A1 11/2017 Lang et al.
2017/0345880 A1 * 11/2017 Kim ..................... H10K 59/122
2019/0361550 A1 11/2019 Sonoda et al.
2020/0043997 A1 * 2/2020 Sonoda ................ H10K 59/124
2020/0127233 A1 4/2020 Sung et al.
2020/0144536 A1 * 5/2020 Kim ........................ C03C 27/06
2020/0243637 A1 7/2020 Lee et al.
(Continued)

FOREIGN PATENT DOCUMENTS

DE 112015005179 B4 2/2019
JP 2008211191 A 9/2008
(Continued)

*Primary Examiner* — Mariceli Santiago
(74) *Attorney, Agent, or Firm* — Seed Intellectual Property Law Group LLP

(57) ABSTRACT

Provided is a display device. The display device comprises a first substrate which includes an active area including a plurality of sub pixels and a non-active area adjacent to the active area and is formed of one of transparent conducting oxide and an oxide semiconductor, an inorganic layer disposed on the first substrate, a planarization layer disposed on the inorganic layer, a bank disposed on the planarization layer, an adhesive layer disposed on the inorganic layer, the planarization layer, and the bank, and a second substrate disposed on the adhesive layer, wherein the bank includes a first bank disposed in an area overlapping the first substrate and a second bank disposed to enclose a side surface of the first bank to improve a moisture permeation prevention characteristic and reduce cracks generated at an outer peripheral area.

20 Claims, 17 Drawing Sheets

(56) References Cited

U.S. PATENT DOCUMENTS

| | | | | |
|---|---|---|---|---|
| 2021/0020733 | A1* | 1/2021 | Saida | H05B 33/22 |
| 2021/0050398 | A1 | 2/2021 | Kim et al. | |
| 2021/0202637 | A1 | 7/2021 | Kim et al. | |
| 2022/0238598 | A1 | 7/2022 | Heo et al. | |

FOREIGN PATENT DOCUMENTS

| | | | |
|---|---|---|---|
| JP | 2018063910 | A | 4/2018 |
| KR | 20190081853 | A | 7/2019 |
| TW | 202226587 | A | 7/2022 |
| WO | WO 2020049811 | A1 | 3/2020 |

* cited by examiner

DISPLAY DEVICE

CROSS-REFERENCE TO RELATED APPLICATIONS

This application claims the priority of Korean Patent Application No. 10-2022-0103431 filed on Aug. 18, 2022, in the Korean Intellectual Property Office, the disclosure of which is incorporated herein by reference.

BACKGROUND

Technical Field

The present disclosure relates to a display device, and more particularly, to a display device which improves a moisture permeation prevention characteristic.

Description of the Related Art

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions, and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

BRIEF SUMMARY

The disclosure is related to a display device that does not use a plastic substrate, which improves a moisture permeation prevention characteristic and reduces cracks generated at an outer peripheral area.

The present disclosure provides a display device which uses one of a transparent conducting oxide layer and an oxide semiconductor layer as a substrate, instead of a plastic substrate.

The present disclosure provides a display device in which cracks of a substrate and an inorganic layer generated at an outer peripheral area of the display device is reduced.

The present disclosure provides a display device in which a seal member is removed to reduce a bezel area.

Technical features and benefits of the present disclosure are not limited to those mentioned above, and other technical features and benefits, which are not mentioned above, can be clearly understood by those skilled in the art from the following descriptions.

According to an aspect of the present disclosure, there is provided a display device. The display device comprises a first substrate which includes an active area including a plurality of sub pixels and a non-active area enclosing the active area and is formed of one of transparent conducting oxide and an oxide semiconductor, an inorganic layer disposed on the first substrate, a planarization layer disposed on the inorganic layer, a bank disposed on the planarization layer, an adhesive layer disposed on the inorganic layer, the planarization layer, and the bank, and a second substrate disposed on the adhesive layer, wherein the bank includes a first bank disposed in an area overlapping the first substrate and a second bank disposed to enclose a side surface of the first bank to improve a moisture permeation prevention characteristic and reduce cracks generated at an outer peripheral area.

Other detailed matters of the example embodiments are included in the detailed description and the drawings.

According to the present disclosure, a transparent conductive oxide layer and an oxide semiconductor layer are used as a substrate of the display device, which easily control a moisture permeability and improve a flexibility.

According to the present disclosure, a bank is disposed at an outside of the first substrate, which easily separates a temporary substrate.

According to the present disclosure, cracks of the inorganic layer and the first substrate generated from an outer peripheral portion of the display device are reduced, which improves the reliability of the display device.

According to the present disclosure, a seal member disposed on an outer peripheral portion of the display device is removed, which reduces the area of a non-active area.

The technical effects according to the present disclosure are not limited to the contents specifically mentioned herein, and more various effects are included in the scope of present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
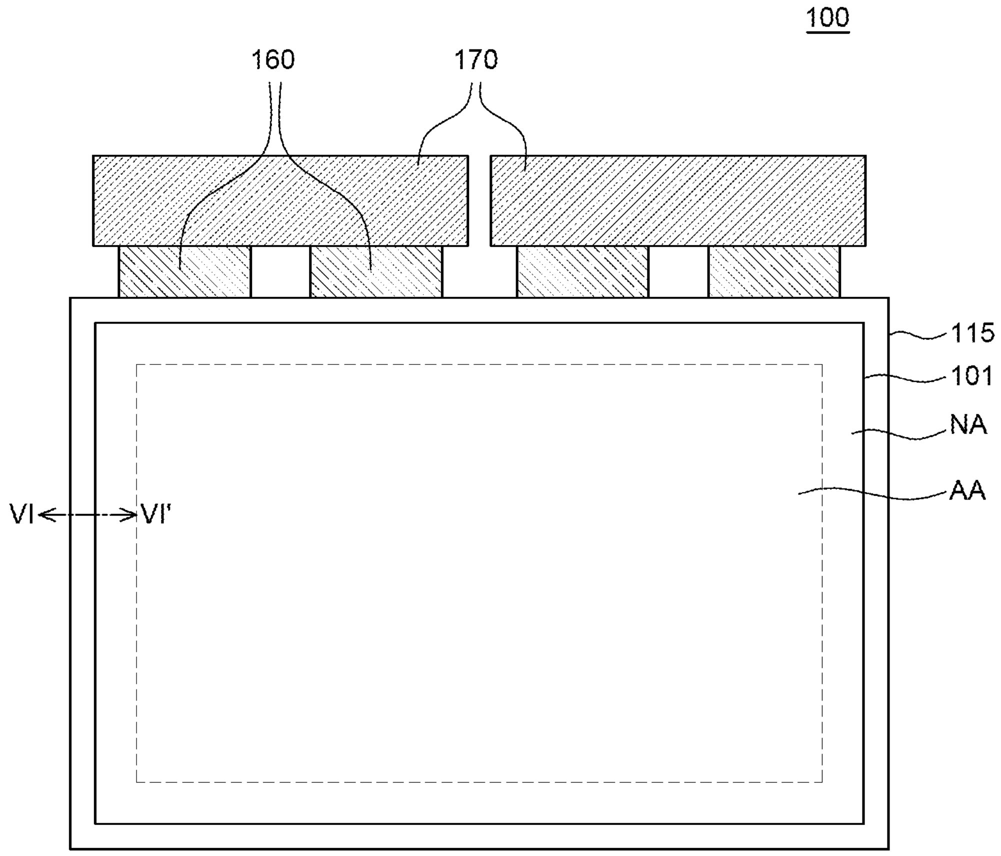
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “consist of” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on,” “above,” “below,” and “next,” one or more parts may be positioned between the two parts unless the terms are used with the term “immediately” or “directly.”

When an element or layer is disposed “on” another element or layer, another layer or another element may be interposed directly on the other element or therebetween.

Although the terms “first,” “second,” and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

Figure 2:
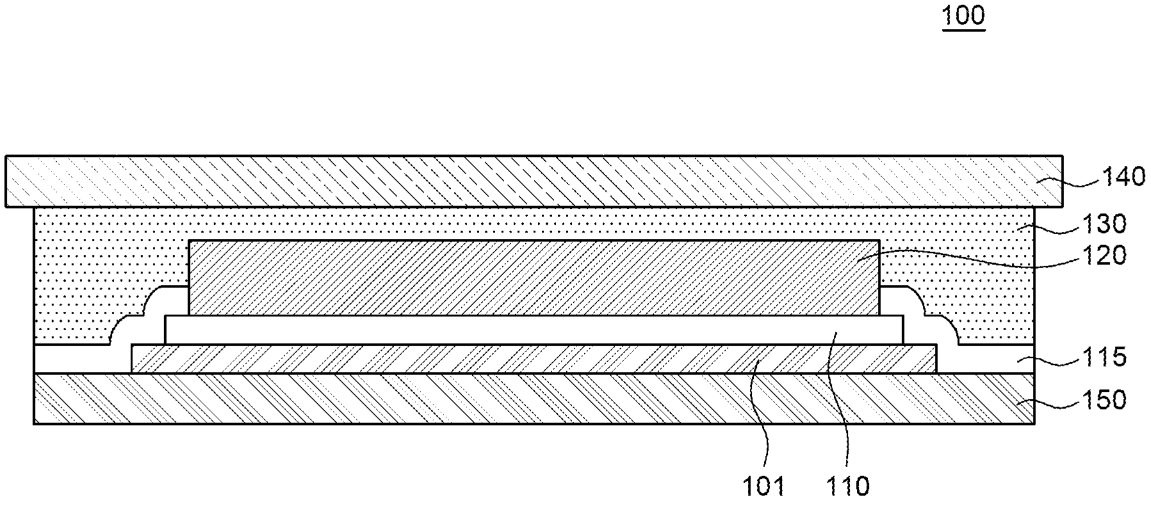
FIG. 2 is a schematic cross-sectional view of a display device according to an example embodiment of the present disclosure.

FIG. 1 is a plan view of a display device according to an example embodiment of the present disclosure. FIG. 2 is a schematic cross-sectional view of a display device according to an example embodiment of the present disclosure. For the convenience of description, in FIG. 1, among various components of the display device 100, only a first substrate 101, a plurality of flexible films 160, and a plurality of printed circuit boards 170 are illustrated.

Referring to FIGS. 1 and 2, the first substrate 101 is a support member which supports other components of the display device 100. The first substrate 101 may be formed of any one of a transparent conducting oxide and an oxide semiconductor. For example, the first substrate 101 may be formed of a transparent conducting oxide (TCO), such as indium tin oxide (ITO), indium zinc oxide (IZO), or indium tin zinc oxide (ITZO).

Further, the first substrate 101 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the first substrate 101 may be formed by another transparent conducting oxide and oxide semiconductor material which have not been described in the specification, but is not limited thereto.

In some implementations, the first substrate 101 may include more than one material. For example, the first substrate 101 may include two or more transparent conducting oxides, two or more oxide semiconductor materials, or one or more transparent conducting oxides and one or more oxide semiconductor materials.

In the meantime, the first substrate 101 may be formed by depositing the transparent conducting oxide or an oxide semiconductor with a very thin thickness. Therefore, as the first substrate 101 is formed to have a very thin thickness, the substrate may have a flexibility. A display device 100 including the first substrate 101 having a flexibility may be implemented as a flexible display device 100 which may display an image even in a folded or rolled state. For example, when the display device 100 is a foldable display device, the first substrate 101 may be folded or unfolded with respect to a folding axis. As another example, when the display device 100 is a rollable display device, the display device may be stored by being rolled around the roller. Accordingly, the display device 100 according to the example embodiment of the present disclosure uses a first substrate 101 having a flexibility to be implemented as a flexible display device 100 like a foldable display device or a rollable display device.

Further, the display device 100 according to the example embodiment of the present disclosure uses a first substrate 101 formed of a transparent conducting oxide or an oxide semiconductor to perform a laser lift off (LLO) process. The LLO process refers to a process of separating a temporary substrate below the first substrate 101 and the first substrate 101 using laser during the manufacturing process of a display device 100. Accordingly, the first substrate 101 is a layer for more easily performing the LLO process so that it may be referred to as a functional thin film, a functional thin film layer, or a functional substrate. The LLO process will be described in more detail below.

The first substrate 101 includes an active area AA and a non-active area NA.

The active area AA is an area where images are displayed. In the active area AA, a pixel unit 120 configured by a plurality of sub pixels may be disposed to display images. For example, the pixel unit 120 includes by a plurality of sub pixels including a light emitting diode and a driving circuit to display images.

The non-active area NA is an area where no image is displayed, and various wiring lines and driving ICs for driving the sub pixels disposed in the active area AA are disposed. For example, in the non-active area NA, various driving ICs such as a gate driver IC and a data driver IC may be disposed.

The plurality of flexible films 160 is disposed at one end of the first substrate 101. The plurality of flexible films 160 is electrically connected to one end of the first substrate 101. The plurality of flexible films 160 is films in which various components are disposed on a base film having flexibility to supply a signal to the plurality of sub pixels of the active area AA. One ends of the plurality of flexible films 160 are disposed in the non-active area NA of the first substrate 101 to supply a data voltage to the plurality of sub pixels of the active area AA. In the meantime, even though it is illustrated that the plurality of flexible films 160 is four in FIG. 1, the number of flexible films 160 may vary depending on the design, but is not limited thereto.

In the meantime, a driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 160 by a chip on film manner, but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design, and is not limited thereto.

Referring to FIG. 2, an inorganic layer 110 is disposed on the first substrate 101. The inorganic layer 110 may be a plurality of inorganic layers including a lower buffer layer 116, an upper buffer layer 111, a gate insulating layer 112, and a passivation layer 113 to be described below. The inorganic layer 110 will be described in more detail below with reference to FIGS. 4 to 6B.

A bank 115 is disposed on the inorganic layer 110. The bank 115 may be disposed in the non-active area NA to enclose the first substrate 101. The bank 115 will be described in more detail below with reference to FIGS. 4 to 6B.

The pixel unit 120 is disposed on the inorganic layer 110. The pixel unit 120 may be disposed so as to correspond to the active area AA. The pixel unit 120 is a component which includes a plurality of sub pixels to display images. The plurality of sub pixels of the pixel unit 120 is minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including an N-type and a P-type semiconductor layers and an emission layer, but is not limited thereto. The driving circuit for driving the plurality of sub pixels may include a driving element such as a thin film transistor or a storage capacitor, but is not limited thereto. Hereinafter, for the convenience of description, it is assumed that the light emitting diode of each of the plurality of sub pixels is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the first substrate 101 on which the light emitting diode is disposed. In the case of the top emission type, a reflective layer may be formed below the anode to allow the light emitted from the organic light emitting diode to travel to the upper portion of the first substrate 101, that is, toward the cathode.

According to the bottom emission type, light emitted from the light emitting diode is emitted to a lower portion of the first substrate 101 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the first substrate 101.

Hereinafter, for the convenience of description, the description will be made by assuming that the display device 100 according to an example embodiment of the present disclosure is a bottom emission type display device, but it is not limited thereto.

An adhesive layer 130 is disposed to cover the pixel unit 120. The adhesive layer 130 serves to bond the first substrate 101 and a second substrate 140 and encloses the pixel unit 120 to protect the light emitting diode of the pixel unit 120 from external moisture, oxygen, and impacts. The adhesive layer 130 may be configured by a face seal manner. For example, the adhesive layer 130 may be formed by forming ultraviolet or thermosetting sealant on the entire surface of the pixel unit 120. However, the structure of the adhesive layer 130 may be formed by various methods and materials, but is not limited thereto.

In the meantime, the second substrate 140 which has a high modulus and is formed of a metal material having a strong corrosion resistance is disposed on the adhesive layer 130. For example, the second substrate 140 may be formed of a material having a high modulus of approximately 200 to 900 MPa. The second substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the second substrate 140 is formed of a metal material, the second substrate 140 may be implemented as an ultra-thin film and provide a strong resistance against external impacts and scratches.

A polarizer 150 is disposed below the first substrate 101. The polarizer 150 selectively transmits light to reduce the reflection of external light which is incident onto the first substrate 101. Specifically, in the display device 100, various metal materials which are applied to semiconductor devices, wiring lines, and light emitting diodes are formed on the first substrate 101. Therefore, the external light incident onto the first substrate 101 may be reflected from the metal material so that the visibility of the display device 100 may be reduced due to the reflection of the external light. At this time, the polarizer 150 which suppresses the reflection of external light is disposed below the first substrate 101 to increase outdoor visibility of the display device 100. However, the polarizer 150 may be omitted depending on an implementation example of the display device 100.

Even though not illustrated in the drawing, a barrier film may be disposed below the first substrate 101 together with the polarizer 150. The barrier film minimizes the permeation of the moisture and oxygen outside the first substrate 101 into the first substrate 101 to protect the pixel unit 120 including a light emitting diode. However, the barrier film may be omitted depending on an implementation example of the display device 100, but it is not limited thereto.

Hereinafter, the plurality of sub pixels of the pixel unit 120 will be described in more detail with reference to FIGS. 3 to 6B.

Figure 3:
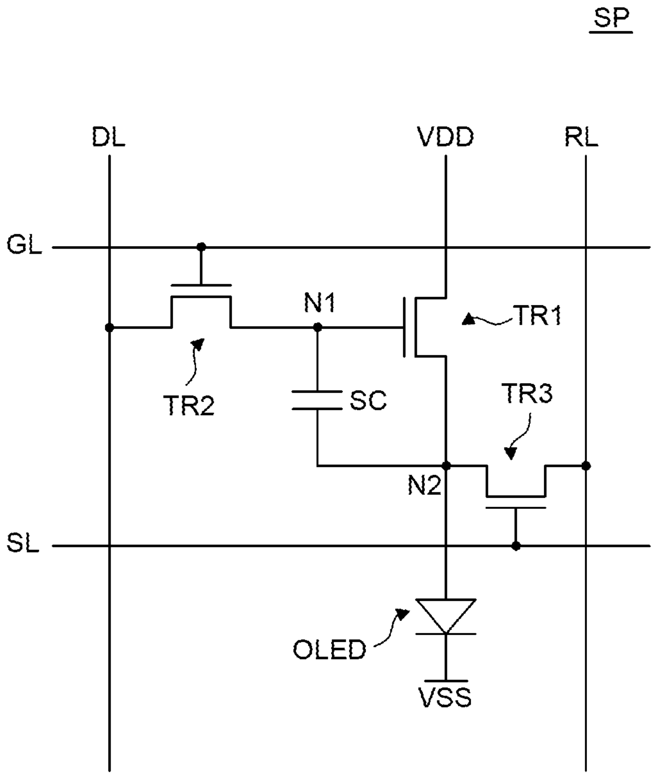
FIG. 3 is a circuit diagram of a sub pixel of a display device according to an example embodiment of the present disclosure.

FIG. 3 is a circuit diagram of a sub pixel of a display device according to an example embodiment of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the first substrate 101.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current may flow from the source electrode to the drain electrode. Since in the N-type thin film transistor, electrons flow from the source electrode to the drain electrode, the current may flow from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 may be turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of the plurality of capacitor electrodes is connected to the first node N1 and the other one may be connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the example embodiment of the present disclosure has a 3T1C structure including three transistors and one storage capacitor SC. However, the number and a connection relationship of the transistors and the storage capacitor may vary in various ways depending on the design and are not limited thereto.

Figure 4:
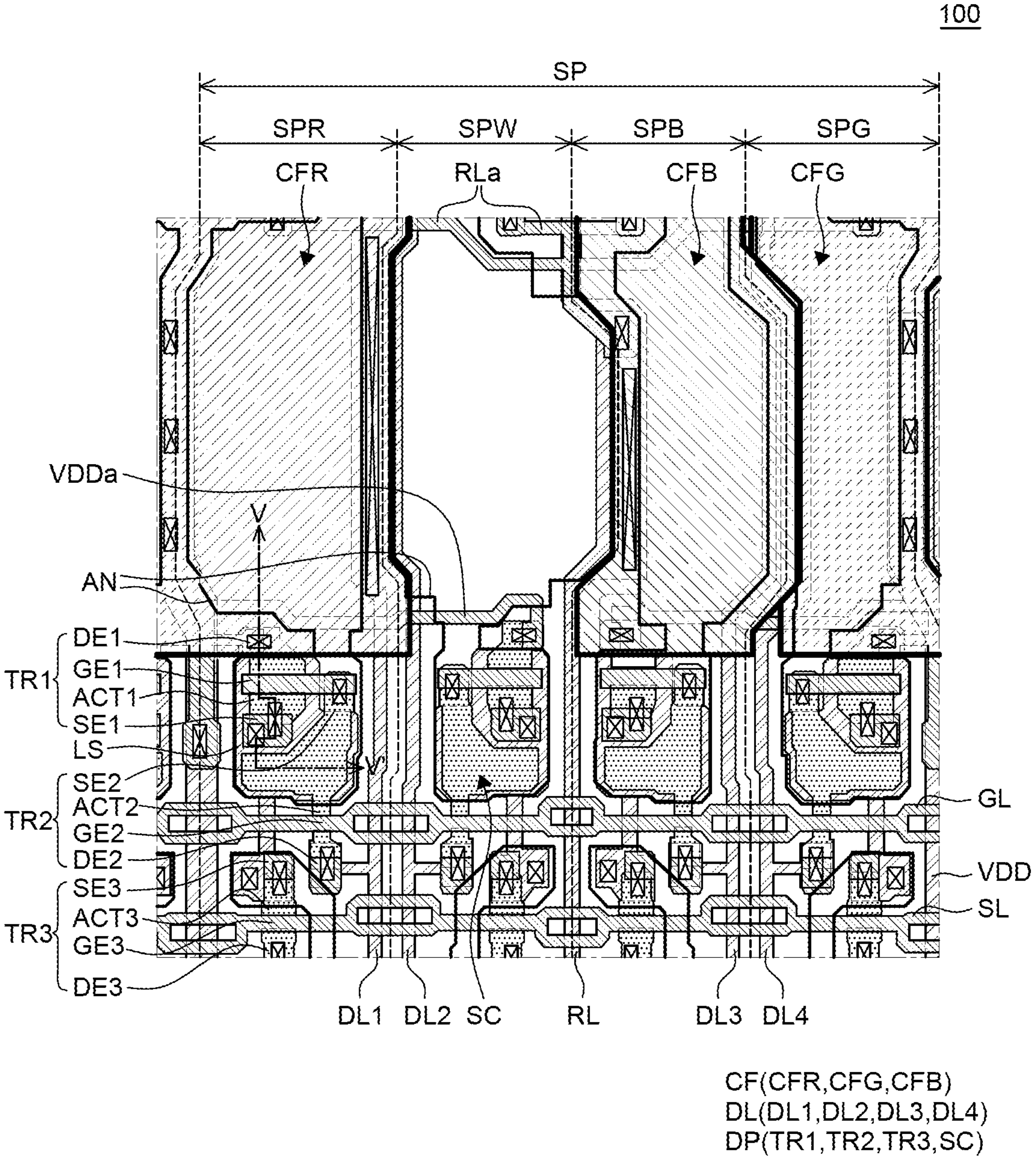
FIG. 4 is an enlarged plan view of a display device according to an example embodiment of the present disclosure.
Figure 5:
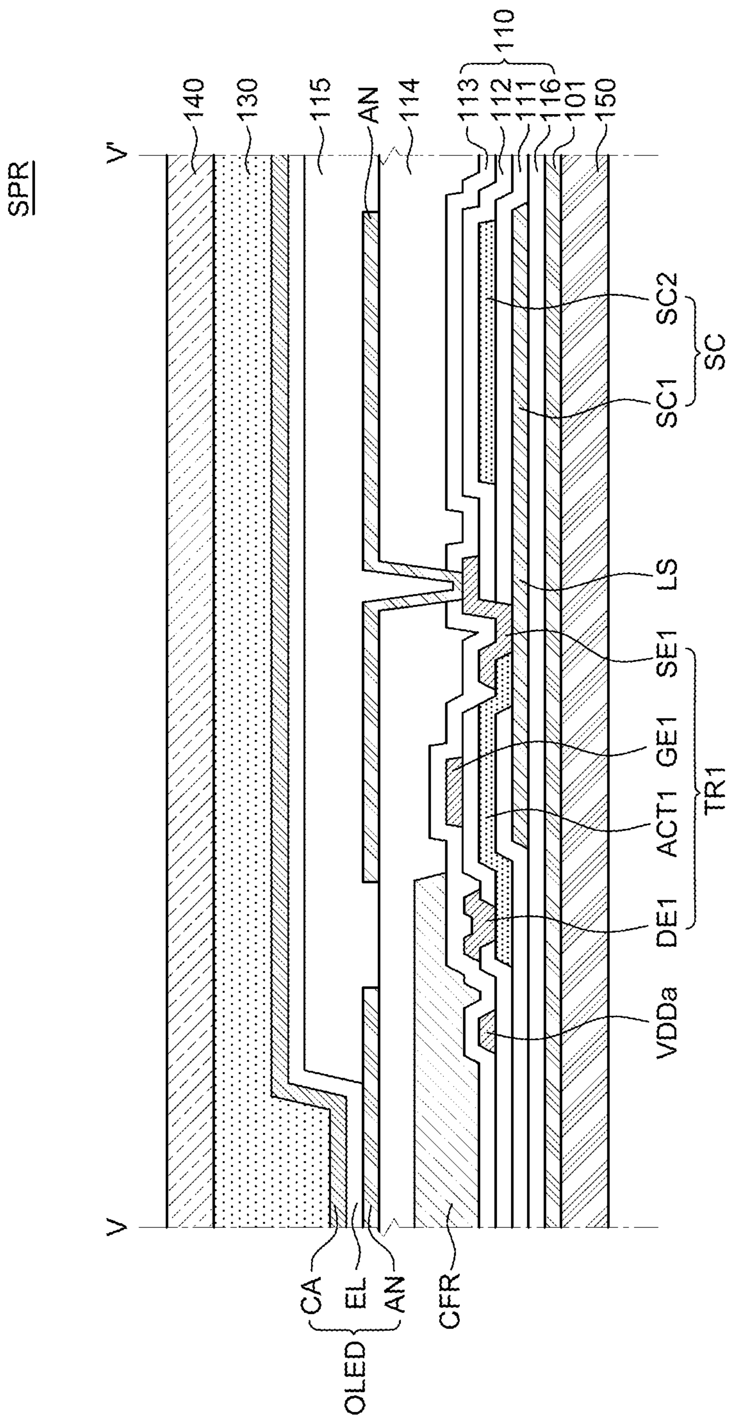
FIG. 5 is a cross-sectional view taken along a line V-V' of FIG. 4.
Figure 6A:
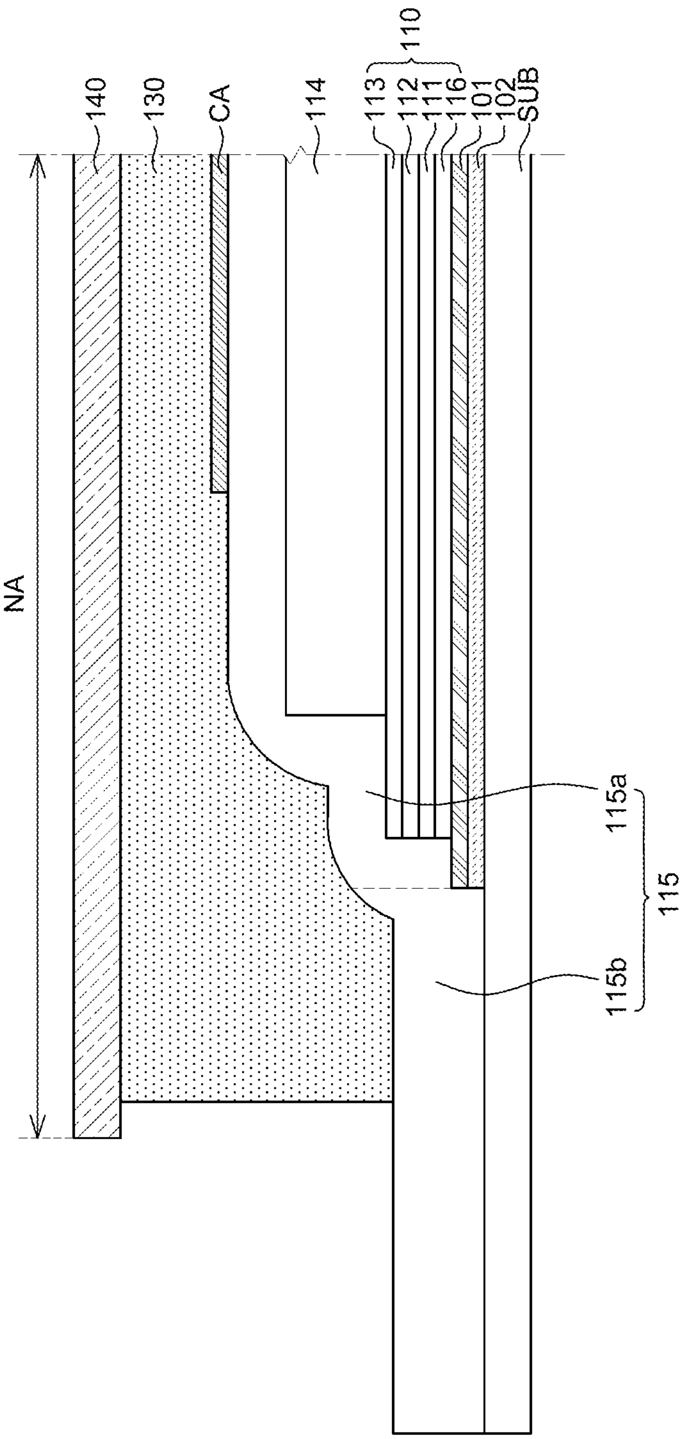
FIG. 6A is a cross-sectional view for explaining a manufacturing process of a display device according to an example embodiment of the present disclosure.
Figure 6B:
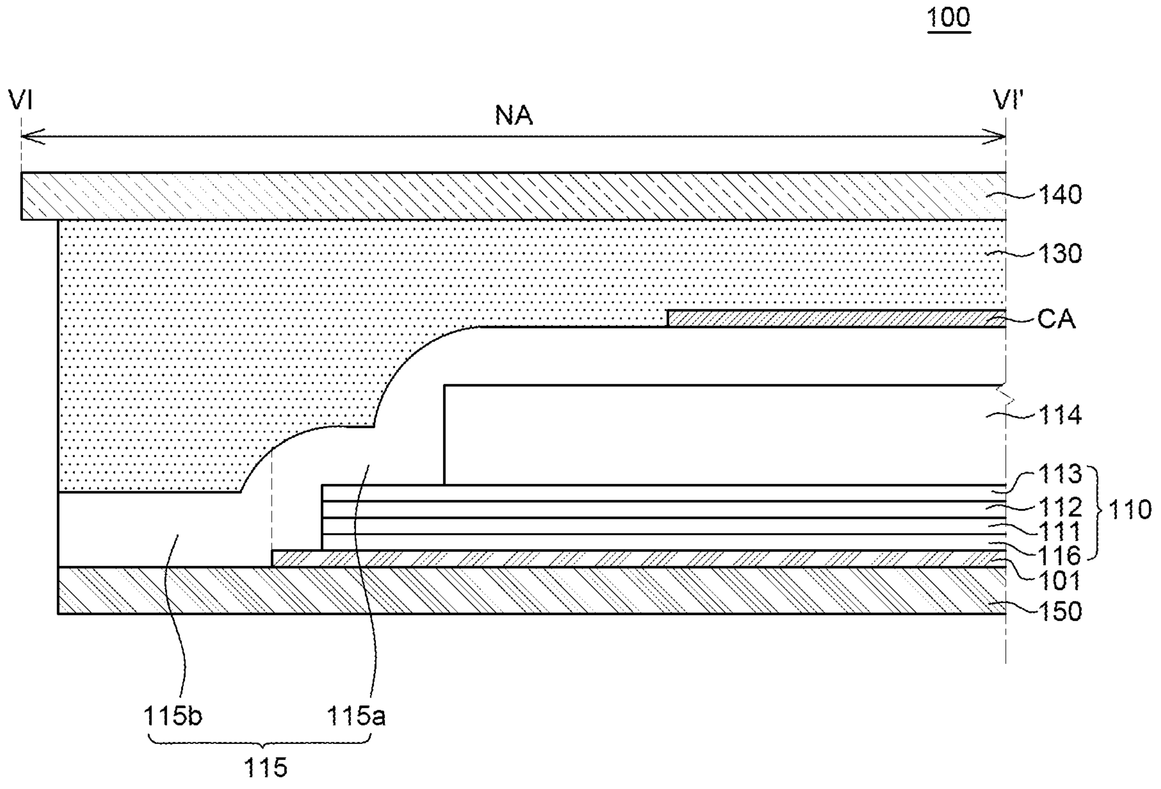
FIG. 6B is a cross-sectional view of a display device according to an example embodiment of the present disclosure.

FIG. 4 is an enlarged plan view of a display device according to an example embodiment of the present disclosure. FIG. 5 is a cross-sectional view taken along the line V-V' of FIG. 4. FIG. 6A is a cross-sectional view for explaining a manufacturing process of a display device according to an example embodiment of the present disclosure. FIG. 6B is a cross-sectional view of a display device according to an example embodiment of the present disclosure before an LLO process. FIG. 4 is an enlarged plan view of a red sub pixel SPR, a white sub pixel SPW, a blue sub pixel SPB, and a green sub pixel SPG which configure one pixel. In FIG. 4, for the convenience of description, the bank 115 is omitted and edges of the plurality of color filters CF are illustrated with a bold solid line. FIGS. 6A and 6B are cross-sectional views taken along the line VI-VI' of FIG. 1. FIG. 6A is a cross-sectional view illustrating a state before an LLO process of a manufacturing process of a display device according to an example embodiment of the present disclosure. Referring to FIGS. 4 to 6B, the display device 100 according to the example embodiment of the present disclosure includes a first substrate 101, an inorganic layer 110, a planarization layer 114, a bank 115, a first transistor TR1, a second transistor TR2, a third transistor TR3, a storage capacitor SC, a light emitting diode OLED, a gate line GL, a sensing line SL, a data line DL, a reference line RL, a high potential power line VDD, a plurality of color filters CF, an adhesive layer 130, and a second substrate 140.

Referring to FIG. 4, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area and a circuit area. The emission area is an area where one color light may be independently emitted and the light emitting diode OLED may be disposed therein. In some implementations, in an area where the plurality of color filters CF and the anode AN overlap, an area which is exposed from the bank 115 to allow light emitted from the light emitting diode OLED to travel to the outside may be referred to as an emission area. For example, referring to FIGS. 4 and 5 together, an emission area of the red sub pixel SPR may be an area exposed from the bank 115 in an area in which the red color filter CFR and the anode AN overlap. An emission area of the green sub pixel SPG may be an area exposed from the bank 115 in an area in which the green color filter CFG and the anode AN overlap. An emission area of the blue sub pixel SPB may be an area exposed from the bank 115 in an area in which the blue color filter CFB and the anode AN overlap. At this time, in an emission area of the white sub pixel SPW in which a separate color filter CF is not disposed, an area overlapping a part of the anode AN exposed from the bank 115 may be a white emission area which emits white light.

The circuit area is an area excluding the emission area and a driving circuit DP for driving the plurality of light emitting diodes OLED and a plurality of wiring lines which transmits various signals to the driving circuit DP may be disposed. The circuit area in which the driving circuit DP, the plurality of wiring lines, and the bank 115 are disposed may be a non-emission area. For example, in the circuit area, the driving circuit DP including the first transistor TR1, the second transistor TR2, the third transistor TR3, and the storage capacitor SC, a plurality of high potential power lines VDD, a plurality of data lines DL, a plurality of reference lines RL, a plurality of gate lines GL, a sensing line SL, and the bank 115 may be disposed.

Referring to FIGS. 3 to 6B together, an inorganic layer 110 is disposed on the first substrate 101. The inorganic layer 110 may include a plurality of layers of one or more inorganic material disposed on the first substrate 101. For example, the inorganic layer 110 may include a lower buffer layer 116, an upper buffer layer 111, a gate insulating layer 112, and a passivation layer 113, but is not limited thereto.

The inorganic layer 110 may be disposed so as to expose an end of the first substrate 101. For example, an end of the inorganic layer 110 may be disposed inside the end or edge of the first substrate 101. However, it is not limited thereto, and the end or edge of the inorganic layer 110 may coincide with the end of the first substrate 101.

The lower buffer layer 116 is disposed on the first substrate 101. The lower buffer layer 116 may suppress moisture and/or oxygen which penetrates from the outside of the first substrate 101 from being spread. The moisture permeation characteristic of the display device 100 may be controlled by controlling a thickness or a lamination structure of the lower buffer layer 116. Further, the lower buffer layer 116 may suppress a short defect from being caused when the first substrate 101 formed of a transparent conducting oxide or an oxide semiconductor is in contact with the other configurations such as the pixel unit 120. The lower buffer layer 116 may be formed of an inorganic material, for example, may include a single layer or a plurality of layers of silicon oxide (SiOx) and silicon nitride (SiNx), but is not limited thereto.

The plurality of high potential power lines VDD, the plurality of data lines DL, the plurality of reference lines RL, and the light shielding layer LS are disposed on the lower buffer layer 116.

The plurality of high potential power lines VDD, the plurality of data lines DL, the plurality of reference lines RL, and the light shielding layer LS are disposed on the same layer on the first substrate 101 and may be formed of the same conductive material. For example, the plurality of high potential power lines VDD, the plurality of data lines DL, the plurality of reference lines RL, and the light shielding layer LS may be configured by a conductive material such as copper (Cu), aluminum (Al), molybdenum (Mo), nickel (Ni), titanium (Ti), chrome (Cr), or an alloy thereof, but are not limited thereto.

The plurality of high potential power lines VDD is wiring lines which transmit the high potential power signal to each of the plurality of sub pixels SP. The plurality of high potential power lines VDD may extend between the plurality of sub pixels SP in a column direction, and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

Referring to FIGS. 4 and 5 together, a light shielding layer LS is disposed on the lower buffer layer 116. The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap the first active layer ACT1, light incident from the lower portion of the first substrate 101 onto the first active layer ACT may be blocked. Accordingly, the reliability of the first transistor TR1 may be improved. However, it is not limited thereto and the light shielding layer LS may be disposed so as to overlap the second active layer ACT2 of the second transistor TR2 and the third active layer ACT3 of the third transistor TR3.

In the meantime, even though in the drawing, it is illustrated that the light single layer LS is a single layer, the light shielding layer LS may be formed as a plurality of layers. For example, the light shielding layer LS may be formed between the inorganic layers 110, that is, formed of a plurality of layers disposed so as to overlap each other, with at least one of the lower buffer layer 116, the upper buffer layer 111, the gate insulating layer 112, and the passivation layer 113 therebetween.

The upper buffer layer 111 is disposed on the plurality of high potential power lines VDD, the plurality of data lines DL, the plurality of reference lines RL, and the light shielding layer LS. The upper buffer layer 111 may reduce permeation of moisture or impurities through the first substrate 101. For example, the upper buffer layer 111 may be configured by a single layer or a plurality of layers of silicon oxide (SiOx) or silicon nitride (SiNx), but is not limited thereto. Further, the upper buffer layer 111 may be omitted depending on a type of first substrate 101 or a type of transistor, but is not limited thereto.

In each of the plurality of sub pixels SP, the first transistor TR1, the second transistor TR2, the third transistor TR3, and the storage capacitor SC are disposed on the upper buffer layer 111.

First, the first transistor TR1 includes a first active layer ACT1, a first gate electrode GE1, a first source electrode SE1, and a first drain electrode DE1.

The first active layer ACT1 is disposed on the upper buffer layer 111. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a plurality of layers of silicon oxide (SiOx) or silicon nitride (SiNx), but is not limited thereto.

The first gate electrode GE1 is disposed on the gate insulating layer 112 so as to overlap the first active layer ACT1. The first gate electrode GE1 may be configured by a conductive material, such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 112. The first source electrode SE1 and the first drain electrode DE1 may be electrically connected to the first active layer ACT1 through a contact hole formed on the gate insulating layer 112. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPG.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end may be electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 112 and the upper buffer layer 111. The other end of the auxiliary high potential power line VDDa extends to the first drain electrode DE1 to be integrally formed with the first drain electrode DE 1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through a contact hole formed on the gate insulating layer 112 and the upper buffer layer 111. Further, a part of the first active layer ACT1 connected to the first source electrode SE1 may be electrically connected to the light shielding layer LS through a contact hole formed on and the upper buffer layer 111. If the light shielding layer LS is floated, a threshold voltage of the first transistor TR1 fluctuates to affect the driving of the display device 100. Accordingly, the light shielding layer LS is electrically connected to the first source electrode SE1 to apply a voltage to the light shielding layer LS and the driving of the first transistor TR1 may not be affected. However, in the present specification, even though it has been described that both the first active layer ACT1 and the first source electrode SE1 are in contact with the light shielding layer LS, only any one of the first source electrode SE1 and the first active layer ACT1 may be in direct contact with the light shielding layer LS. However, it is not limited thereto.

In the meantime, even though in FIG. 5, it is illustrated that the gate insulating layer 112 is formed on the entire surface of the first substrate 101, the gate insulating layer 112 may be patterned so as to overlap only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the upper buffer layer 111. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the upper buffer layer 111. The second source electrode SE2 may be integrally formed with the second active layer ACT2 to be electrically connected to each other. For example, the semiconductor material is formed on the upper buffer layer 111 and a part of the semiconductor material is conducted to form the second source electrode SE2. Therefore, a part of the semiconductor material which is not conducted may become a second active layer ACT2 and a conducted part may serve as a second source electrode SE2. However, the second active layer ACT2 and the second source electrode SE2 may be separately formed, but are not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 112. Accordingly, the first transistor TR1 may be turned on or turned off by a signal from the second transistor TR2.

The gate insulating layer 112 is disposed on the second active layer ACT2 and the second source electrode SE2. The second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

In the meantime, the second gate electrode GE2 may extend from the gate line GL. That is, the second gate electrode GE2 may be integrally formed with the gate line GL and the second gate electrode GE2 and the gate line GL may be formed of the same conductive material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 112. The second drain electrode DE2 is electrically connected to the second active layer ACT2 through a contact hole formed in the gate insulating layer 112 and may be electrically connected to one of the plurality of data lines DL through a contact hole formed in the gate insulating layer 112 and the upper buffer layer 111, simultaneously. For example, the second drain electrode DE2 of the red sub pixel SPR is electrically connected to the first data line DL1 and the second drain electrode DE2 of the white sub pixel SPW may be electrically connected to the second data line DL2. For example, the second drain electrode DE2 of the blue sub pixel SPB is electrically connected to the third data line DL3 and the second drain electrode DE2 of the green sub pixel SPG may be electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the upper buffer layer 111. The third active layer ACT3 may be formed of a semiconductor material, such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region, and the source region and the drain region may be conductive regions, but are not limited thereto.

The gate insulating layer 112 is disposed on the third active layer ACT3. The third gate electrode GE3, the third source electrode SE3, and the third drain electrode DE3 are disposed on the gate insulating layer 112.

The third gate electrode GE3 is disposed on the gate insulating layer 112 so as to overlap the third active layer ACT3. The third gate electrode GE3 may be electrically connected to the sensing line SL, and the third transistor TR3 may be turned on or turned off based on the sensing voltage transmitted to the third transistor TR3. The third gate electrode GE3 may be configured by a conductive material, such as copper (Cu), aluminum (Al), molybdenum (Mo), nickel (Ni), titanium (Ti), chrome (Cr), or an alloy thereof, but is not limited thereto.

In the meantime, the third gate electrode GE3 may extend from the sensing line SL. That is, the third gate electrode GE3 may be integrally formed with the sensing line SL and the third gate electrode GE3 and the sensing line SL may be formed of the same conductive material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 112. The third source electrode SE3 may be configured by a conductive material, such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the upper buffer layer 111. That is, the third source electrode SE3 may be electrically connected to the light shielding layer LS with the third active layer ACT3 therebetween. Therefore, the third source electrode SE3 and the first source electrode SE1 may be electrically connected to each other by means of the light shielding layer LS.

The third drain electrode DE3 may be electrically connected to the third active layer ACT3 through a contact hole formed on the gate insulating layer 112. The third drain electrode DE3 may be configured by a conductive material, such as copper (Cu), aluminum (Al), molybdenum (Mo), nickel (Ni), titanium (Ti), chrome (Cr), or an alloy thereof, but is not limited thereto.

The third drain electrode DE3 may be electrically connected to the reference line RL. For example, the third drain electrodes DE3 of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which is disposed in parallel along the row direction. The auxiliary reference line Rla extends in the row direction to electrically connect the reference line RL and the third drain electrode DE3 of each of the plurality of sub pixels SP. One end of the auxiliary reference line Rla may be electrically connected to the reference line RL through a contact hole formed in the upper buffer layer 111 and the gate insulating layer 112. The other end of the auxiliary reference line Rla may be electrically connected to the third drain electrode DE3 of each of the plurality of sub pixels SP. In this case, the auxiliary reference line Rla may be integrally formed with the third drain electrode DE3 of each of the plurality of sub pixels SP, and a reference voltage from the reference line RL may be transmitted to the third drain electrode DE3 by means of the auxiliary reference line Rla. However, the auxiliary reference line Rla may be separately formed from the third drain electrode DE3, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode SC1 and a second capacitor electrode SC2.

In each of the plurality of sub pixels SP, the first capacitor electrode SC1 is disposed between the lower buffer layer 116 and the upper buffer layer 111. The first capacitor electrode SC1 may be disposed to be the closest to the first substrate 101 among the conductive components disposed on the first substrate 101. The first capacitor electrode SC1 may be integrally formed with the light shielding layer LS and may be electrically connected to the first source electrode SE1 by means of the light shielding layer LS.

The upper buffer layer 111 is disposed on the first capacitor electrode SC1 and the second capacitor electrode SC2 is disposed on the upper buffer layer 111. The second capacitor electrode SC2 may be disposed so as to overlap the first capacitor electrode SC1. The second capacitor electrode SC2 is integrally formed with the second source electrode SE2 to be electrically connected to the second source electrode SE2 and the first gate electrode GE1. For example, the semiconductor material is formed on the upper buffer layer 111 and a part of the semiconductor material is conductorized to form the second source electrode SE2 and the second capacitor electrode SC2. Accordingly, a part of the semiconductor material which is not conductorized functions as a second active layer ACT2 and the conductorized part may function as a second source electrode SE2 and the second capacitor electrode SC2. As described above, the first gate electrode GE1 is electrically connected to the second source electrode SE2 through the contact hole formed in the gate insulating layer 112. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the active layer ACT2 to be electrically connected to the second source electrode SE2 and the first gate electrode GE1. Accordingly, the first capacitor electrode SC1 and the second capacitor electrode SC2 which overlap with the upper buffer layer 111 therebetween constantly maintain the voltage of the first gate electrode GE1 and the first source electrode SE1 of the first transistor TR1 to maintain the constant state of the light emitting diode OLED.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a plurality of layers of silicon oxide (SiOx) or silicon nitride (SiNx), but is not limited thereto. Further, the passivation layer 113 may be omitted depending on the example embodiment.

A plurality of color filters CF is disposed in the emission area of each of the plurality of sub pixels SP on the passivation layer 113. As described above, the display device 100 according to the example embodiment of the present disclosure is a bottom emission type in which light emitted from the light emitting diode OLED is directed to the lower portion of the light emitting diode OLED and the first substrate 101. Therefore, the plurality of color filters CF may be disposed below the light emitting diode OLED. Light emitted from the light emitting diode OLED passes through the plurality of color filters CF and may be implemented as various colors of light.

The plurality of color filters CF includes a red color filter CFR, a blue color filter CFB, and a green color filter CFG. The red color filter CFR may be disposed in an emission area of a red sub pixel SPR of the plurality of sub pixels SP, the blue color filter CFB may be disposed in an emission area of the blue sub pixel SPB, and the green color filter CFG may be disposed in an emission area of the green sub pixel SPG.

The planarization layer 114 is disposed on the passivation layer 113 and the plurality of color filters CF.

The planarization layer 114 is an insulating layer which planarizes an upper portion of the first substrate 101 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be formed of an organic material, for example, may be configured by an acryl based single layer or a plurality of layers, but is not limited thereto.

The light emitting diode OLED is disposed in an emission rea of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN may extend toward the circuit area. A part of the anode AN may extend toward the first source electrode SE1 of the circuit area from the emission area, and may be electrically connected to the first source electrode SE1 through a contact hole formed in the planarization layer 114 and the passivation layer 113. Accordingly, the anode AN of the light emitting diode OLED extends to the circuit area to be electrically connected to the first source electrode SE1 of the first transistor TR1 and the second capacitor electrode SC2 of the storage capacitor SC.

In the emission area and the circuit area, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emits different color light is laminated. The emission layer EL may further include an organic layer, such as a hole injection layer, a hole transport layer, an electron transport layer, and an electron injection layer.

The cathode CA is disposed on the emission layer EL in the emission area and the circuit area. The cathode CA supplies electrons to the emission layer EL so that the cathode may be formed of a conductive material having a low work function. The cathode CA may be formed as one layer over the plurality of sub pixels SP. That is, each of the cathodes CA of the plurality of sub pixels SP are connected to be integrally formed. For example, the cathode CA may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 6A, the cathode CA of the light emitting diode OLED is electrically connected to the low potential power line VSS to be supplied with a low potential power voltage.

The bank 115 is disposed between the anode AN and the emission layer EL. The bank 115 is disposed to overlap the active area AA and to cover the edge of the anode AN. The bank 115 is disposed at the boundary between the sub pixels SP which are adjacent to each other to reduce the mixture of light emitted from the light emitting diode OLED of each of the plurality of sub pixels SP. The bank 115 may be formed of an insulating material, and for example, formed of polyimide, but is not limited thereto.

In the meantime, the bank 115 may include a first bank **115*a* and a second bank 115*b*. The first bank 115*a* and the second bank 115*b* may be integrally formed with the same material. The first bank 115*a* is disposed in an area overlapping the first substrate 101 and the second bank 115*b* is disposed in an area which does not overlap the first substrate 101. Therefore, the second bank 115*b* may be disposed to enclose a side surface of the first bank 115*a*, the inorganic layer 110, the planarization layer 114, and the first substrate 101. The first bank 115*a* is disposed in the area overlapping the first substrate 101 so that the bank 115 illustrated in FIG. 5 corresponds to the first bank 115*a*. The bank 115 disposed in the non-active area NA will be described in detail with reference to FIGS. 6A and 6**B.

Referring to FIG. 6B, in the non-active area NA, the polarizer 150, the first substrate 101, the inorganic layer 110, the planarization layer 114, the bank 115, the cathode CA, the adhesive layer 130, and the second substrate 140 are sequentially disposed. The non-active area NA illustrated in FIG. 6B is a non-active area NA of a side portion excluding one side in which the flexible film 160 is disposed on the first substrate 101.

In the manufacturing process, referring to FIG. 6A, a temporary substrate SUB is disposed below the first substrate 101 with a larger area than the first substrate 101 to cover a bottom surface of the first substrate 101. The temporary substrate SUB is a substrate which supports the first substrate 101 and components disposed on the first substrate 101 during the manufacturing process of the display device 100. The temporary substrate SUB may be formed of a material having a rigidity. For example, the temporary substrate SUB may be formed of glass, but is not limited thereto.

A sacrificial layer 102 is disposed on the temporary substrate SUB. The sacrificial layer 102 is a layer formed to easily separate the temporary substrate SUB and the first substrate 101 from each other. Therefore, the sacrificial layer 102 is disposed with the same area as the first substrate 101 and may be formed with a smaller area than the temporary substrate SUB. Laser is irradiated onto the sacrificial layer 102 from the lower portion of the temporary substrate SUB to dehydrogenate the sacrificial layer 102 and to separate the temporary substrate SUB and the sacrificial layer 102 from the first substrate 101. For example, the sacrificial layer 102 may use hydrogenated amorphous silicon or amorphous silicon which is hydrogenated and doped with impurities.

The first substrate 101 is disposed on the sacrificial layer 102. The first substrate 101 may be disposed with the same area so as to fully overlap the sacrificial layer 102.

An inorganic layer 110 is disposed on the first substrate 101. An end of the inorganic layer 110 may be located at the inside from the end of the first substrate 101 in the non-active area NA. However, it is not limited thereto, and the end of the inorganic layer 110 may be disposed on the same plane as the end of the first substrate 101.

The planarization layer 114 is disposed on the inorganic layer 110. An end of the planarization layer 114 may be located at the inside from the end of the organic layer 110 in the non-active area NA.

The bank 115 is disposed on the temporary substrate SUB, the first substrate 101, the organic layer 110, and the planarization layer 114. The bank 115 is disposed to cover the entire surface of the temporary substrate SUB. At this time, an area of the bank 115 overlapping the first substrate 101 is referred to as the first bank 115*a*, and an area which does not overlap the first substrate 101 may be referred to as the second bank 115*b*. Therefore, the second bank 115*b* may be in direct contact with the temporary substrate SUB in the non-active area NA.

The cathode CA, the adhesive layer 130, and the second substrate 140 may be disposed on the bank 115. The adhesive layer 130 may be in contact with the bank 115 in an area where the cathode CA is not disposed. Therefore, a part of the second bank 115*b* is in contact with the adhesive layer 130 and the other part may be not in contact with the adhesive layer 130.

Next, the first substrate 101 and the temporary substrate SUB may be separated from each other by means of the LLO process. The sacrificial layer 102 may use hydrogenated amorphous silicon or hydrogenated amorphous silicon doped with impurities. When the laser is irradiated toward the temporary substrate SUB and the sacrificial layer 102 from the lower portion of the temporary substrate SUB, the hydrogen of the sacrificial layer 102 is dehydrogenated and the sacrificial layer 102 and the temporary substrate SUB may be separated from the first substrate 101.

During the LLO process, the temporary substrate SUB disposed at the outside of the first substrate 101 and the second bank 115*b* may be separated. If in an area at the outside of the sacrificial layer, a layer which is formed of a material having a low laser absorptivity is disposed, laser irradiated during the LLO passes through the corresponding layer so that it may be difficult to separate the temporary substrate due to the adhesiveness with the temporary substrate. Even though the corresponding layer is separated from the temporary substrate SUB, crack is generated so that the inorganic layer or the first substrate may be also cracked. The bank 115, that is, the second bank 115*b* is formed of polyimide which is a material having a relatively high laser absorptivity to absorb the laser. Therefore, the second bank 115*b* is deformed to be crumbled or cracked during the LLO process. Therefore, a part of the temporary substrate SUB which is in contact with the second bank 115*b* may be easily separated during the LLO process.

When the LLO process is completed, as illustrated in FIG. 6B, the first substrate 101 and the second bank 115*b* remain. As described above, the second bank 115*b* is deformed to be crumbled or cracked during the LLO process. Therefore, a part of the second bank 115*b* which is in contact with the adhesive layer 130 remains in a state attached to the adhesive layer 130, but a part which is not in contact with the adhesive layer 130 may be removed together during the process of removing the temporary substrate SUB. That is, a part of the second bank 115*b* which is not in contact with the adhesive layer 130 is separated by an external force so that as illustrated in FIG. 6B, finally, only the second bank 115*b* which is in contact with the adhesive layer 130 remains.

Next, the polarizer 150 is disposed below the second bank 115*b* and the first substrate 101.

Referring to FIG. 6B, the second bank 115*b* may be disposed on the same layer or level as the first substrate 101 at the outside of the first substrate 101. The second bank 115*b* may be disposed so as to enclose, e.g., in a lateral direction, the first bank 115*a*, the planarization layer 114, the inorganic layer 110, and the first substrate 101 in the non-active area and may be disposed in the non-active area NA at a side portion excluding one side in which the flexible film 160 is disposed.

One end or edge of the second bank 115*b* may be disposed on the same plane as the end of the adhesive layer 130. As described above, the adhesive layer 130 may hold the second bank 115*b* which is crumbled or cracked so that the end or edge of the second bank 115*b* may be located on the same plane as the end or edge of the adhesive layer 130. However, when a part of the second bank 115*b* is further separated, the end of the second bank 115*b* may be located at the inner side than the end of the adhesive layer 130.

The first bank 115*a* and the remaining second bank 115*b* may have different densities. As descried above, the LLO process is performed on the second bank 115*b* in a state in which the sacrificial layer is not located therebelow but the LLO process is performed on the first bank 115*a* in a state in which the sacrificial layer is located therebelow. Therefore, most of the laser directed to the first bank 115*a* is absorbed by the sacrificial layer so that the first bank 115*a* may be maintained as a single continuous layer without being crumbled or cracked. However, in the case of the second bank 115*b*, the sacrificial layer is not located below the second bank 115*b* and a material of the second bank 115*b* has a relatively high laser absorptivity so that the second bank 115*b* may be crumbled or cracked during the LLO process. Therefore, finally, the second bank 115*b* may be in a state of being cracked or in a state in which powders formed by crumbling the first bank 115*a* are gathered. Accordingly, the density of the second bank 115*b* may be different from the density of the first bank 115*a* and may be smaller than the density of the first bank 115*a*.

In the display device 100 according to the example embodiment of the present disclosure, the first substrate 101 is formed of any one of a transparent conducting oxide and an oxide semiconductor to reduce a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form with a relatively small thickness, e.g., a thickness lower than a predetermined thickness level. In contrast, the transparent conducting oxide and the oxide semiconductor may be formed to have a very thin thickness by the deposition process such as sputtering. Therefore, in the display device 100 according to the example embodiment of the present disclosure, the first substrate 101 which supports various components of the display device 100 includes a transparent conducting oxide layer or an oxide semiconductor layer, which reduces a thickness of the display device 100 and implements a slim design.

Accordingly, in the display device 100 according to the example embodiment of the present disclosure, the first substrate 101 is formed of a transparent conducting oxide or an oxide semiconductor, which improves the flexibility of the display device 100 and reduces the stress generated when the display device 100 is deformed. In some implementations, when the first substrate 101 includes the transparent conducting oxide layer or the oxide semiconductor, the first substrate 101 may be formed as a very thin film. In this case, the first substrate 101 may be also referred to as a first transparent thin film layer. Accordingly, the display device 100 including a first substrate 101 may have a high flexibility and the display device 100 may be easily bent or rolled. Therefore, in the display device 100 according to the example embodiment of the present disclosure, the first substrate 101 is formed by any one of the transparent conducting oxide layer and the oxide semiconductor to improve the flexibility of the display device 100. Accordingly, the stress generated when the display device 100 is deformed may be also relieved so that the cracks caused in the display device 100 may be minimized.

Further, in the display device 100 according to the example embodiment of the present disclosure, the first substrate 101 is formed of any one of a transparent conducting oxide layer and an oxide semiconductor layer to reduce the possibility of generating the static electricity in the first substrate 101. If the first substrate 101 is formed of plastic so that the static electricity is generated, various wiring lines and driving elements on the first substrate 101 are damaged or the driving is affected due to the static electricity so that the display quality may be degraded. Instead, when the first substrate 101 is formed of the transparent conducting oxide layer or the oxide semiconductor layer, the static electricity generated in the first substrate 101 may be minimized and a configuration for blocking and discharging the static electricity may be simplified. Accordingly, in the display device 100 according to the example embodiment of the present disclosure, the first substrate 101 is formed of any one of the transparent conducting oxide layer or the oxide semiconductor having a low possibility of generating the static electricity. By doing this, the damage or the display quality degradation due to the static electricity may be minimized.

Further, in the display device 100 according to the example embodiment of the present disclosure, the first substrate 101 is formed of one of the transparent conducting oxide and the oxide semiconductor to minimize the permeation of the moisture or oxygen of the outside into the display device 100 by means of the first substrate 101. When the first substrate 101 is formed of the transparent conducting oxide layer or the oxide semiconductor, the first substrate 101 is formed in a vacuum environment so that the foreign material generation possibility is significantly low. Further, even though the foreign material is generated, the size of the foreign material is very small so that the permeation of the moisture and oxygen into the display device 100 may be minimized. Accordingly, in the display device 100 according to the example embodiment of the present disclosure, the first substrate 101 is formed of a transparent conducting oxide or the oxide semiconductor having a low possibility of generating the foreign materials and an excellent moisture permeation prevention performance. By doing this, the reliability of the light emitting diode OLED including an organic layer and the display device 100 may be improved.

In the display device 100 according to the example embodiment of the present disclosure, the first substrate 101 is formed of any one of a transparent conducting oxide and an oxide semiconductor, and may be used after attaching a barrier film which is thin and cheap below the first substrate 101. When the first substrate 101 is formed of a material having a low moisture permeation performance, for example, plastic, the moisture permeation prevention performance may be supplemented by attaching a high performance barrier film. However, in the display device 100 according to the example embodiment of the present disclosure, the first substrate 101 is formed of a transparent conducting oxide or an oxide semiconductor having an excellent moisture permeation prevention performance so that a thin and cheap barrier film may be attached below the first substrate 101. Accordingly, in the display device 100 according to the example embodiment of the present disclosure, the first substrate 101 includes any one of the transparent conducting oxide or the oxide semiconductor having an excellent moisture permeation prevention performance to reduce the manufacturing cost of the display device.

Further, in the display device 100 according to the example embodiment of the present disclosure, the first substrate 101 is formed of any one of a transparent conducting oxide and an oxide semiconductor to perform a laser lift off (LLO) process. When the display device 100 is manufactured, a temporary substrate SUB in which a sacrificial layer is formed is attached below the first substrate 101 and then a pixel unit 120 may be formed on the first substrate 101. The sacrificial layer may use a hydrogenated amorphous silicon or an amorphous silicon which is hydrogenated and doped with impurities. After completing the manufacturing of the display device 100, when a laser is irradiated from the lower portion of the temporary substrate SUB, the hydrogen of the sacrificial layer is dehydrogenated and the sacrificial layer and the temporary substrate SUB may be separated from the first substrate 101. At this time, the transparent conducting oxide and the oxide semiconductor are materials which may perform the LLO process with the sacrificial layer and the temporary substrate SUB. Therefore, even though the first substrate 101 is formed of any one of the transparent conducting oxide or the oxide semiconductor, the first substrate 101 may be easily separated from the temporary substrate SUB. Accordingly, in the display device 100 according to the example embodiment of the present disclosure, the first substrate 101 includes any one of the transparent conducting oxide layer or the oxide semiconductor which may perform the LLO process. Therefore, the display device 100 may be easily manufactured with the existing process and equipment.

In the meantime, when the first substrate configured by one of the transparent conducting oxide layer and oxide semiconductor is used as described above, the first substrate may be disposed in the entire area of the display device for the LLO process. That is, the first substrate may be disposed in the entire active area and non-active area of the display device. At this time, the first substrate and the inorganic layer are disposed to an outermost area of the display device. However, when the first substrate and the inorganic layer are disposed in the outermost area, the first substrate and the inorganic layer may be easily cracked to be damaged due to the external impact. Further, when an external force is applied to a boundary of the second substrate having a relatively high rigidity, the first substrate and the inorganic layer may be cracked to be damaged in an area corresponding to a boundary of the second substrate. Therefore, there may be a problem of moisture permeation through the inorganic layer and the reliability may be degraded. Moreover, when the cracks are generated in the first substrate and the inorganic layer, the cracks may propagate to the other component and specifically, when the cracks propagates to the wiring line or a circuit configuration, driving failure may occur.

In the display device 100 according to the example embodiment of the present disclosure, the bank 115 may be configured to include the second bank 115*b* disposed to enclose the inorganic layer 110, the planarization layer 114, and a side surface of the first substrate 101. Accordingly, during the LLO process, the LLO process may be easily performed through the temporary substrate SUB through which laser light transmits and the second bank 115*b* which absorbs the laser. At this time, the bank 115 may be configured by a material having a high absorptivity to the laser. When the planarization layer which is formed of an acrylic resin having a low absorptivity to the laser is in direct contact with the temporary substrate, the laser passes through most of the temporary substrate and the planarization layer so that the temporary substrate and the planarization may not be easily separated. However, like the display device 100 according to the example embodiment of the present disclosure, the bank 115 formed of polyimide having a high absorptivity to the laser is in direct contact with the temporary substrate SUB, the laser is absorbed by the bank 115 so that the bank 115 may be crumbled or cracked. Therefore, during the process of removing the temporary substrate SUB, only the second bank 115*b* which is in contact with the adhesive layer 130 remains among the banks 115, and a portion which is not in contact with the adhesive layer 130 may be removed.

Therefore, in the display device 100 according to the example embodiment of the present disclosure, the LLO process may be easily performed without disposing the first substrate 101 and the inorganic layer at the outer portion of the display device 100.

Therefore, in the display device 100 according to the example embodiment of the present disclosure, the first substrate 101 and the inorganic layer 110 may not be disposed at the outer portion of the display device 100. Further, the first substrate 101 and the inorganic layer 110 may not be disposed even in the area corresponding to the boundary of the second substrate 140. Therefore, the first substrate 101 and the inorganic layer 110 may not be damaged or cracked by the impact from the outside of the display device 100 and a stress applied to the boundary of the second substrate 140. Accordingly, in the display device 100 according to the example embodiment of the present disclosure, the reliability may be improved and the driving failure due to the cracks may also be reduced.

Further, in the display device 100 according to the example embodiment of the present disclosure, a seal member disposed at the outside of the second bank 115*b* and the adhesive layer 130 is removed to reduce the bezel area. Generally, in the display device, the seam member is disposed so as to enclose a side surface of the pixel unit and the adhesive layer. Therefore, the bezel is increased as much as the area in which the seal member is disposed. In the display device 100 according to the example embodiment of the present disclosure, during the LLO process of removing the temporary substrate SUB, the bank disposed at the outside of the adhesive layer 130 is removed so that the necessity of the placement of the seal member may be removed. Therefore, as compared with the case that the seal member is disposed, the bezel area may be reduced.

Figure 7A:
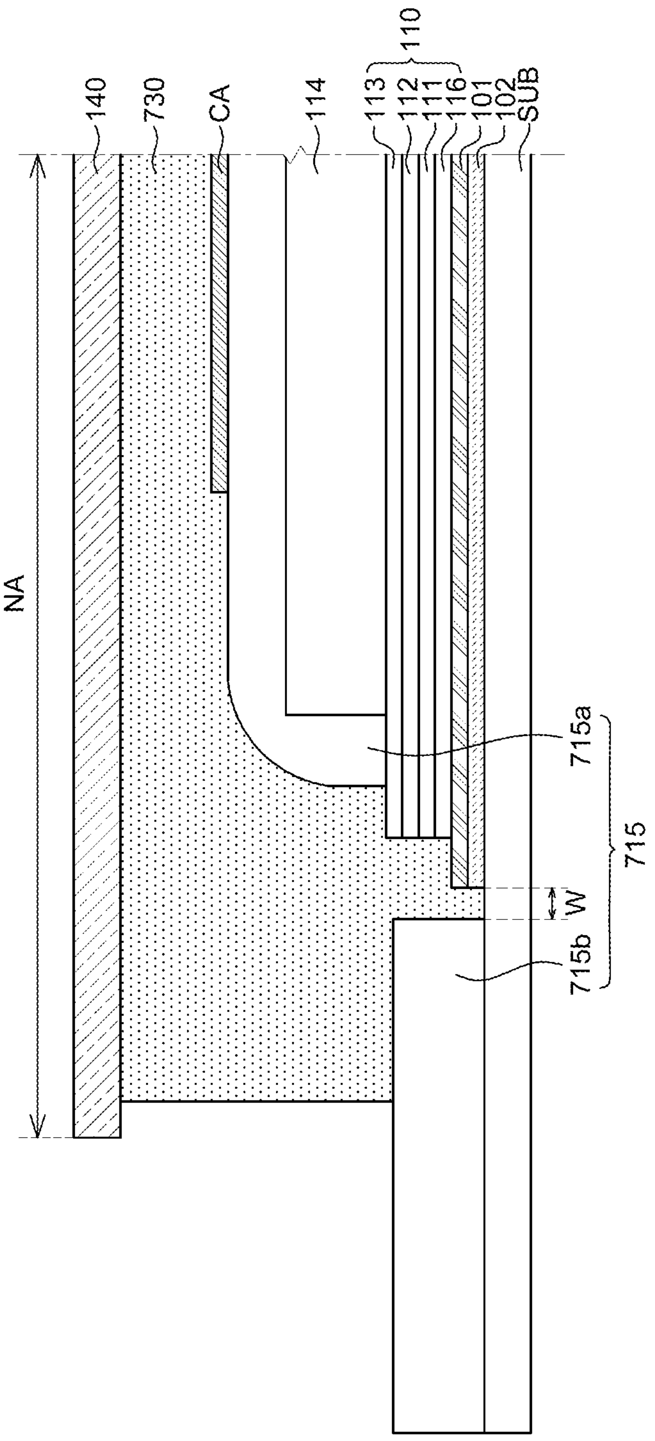
FIG. 7A is a cross-sectional view for explaining a manufacturing process of a display device according to another example embodiment of the present disclosure.
Figure 7B:
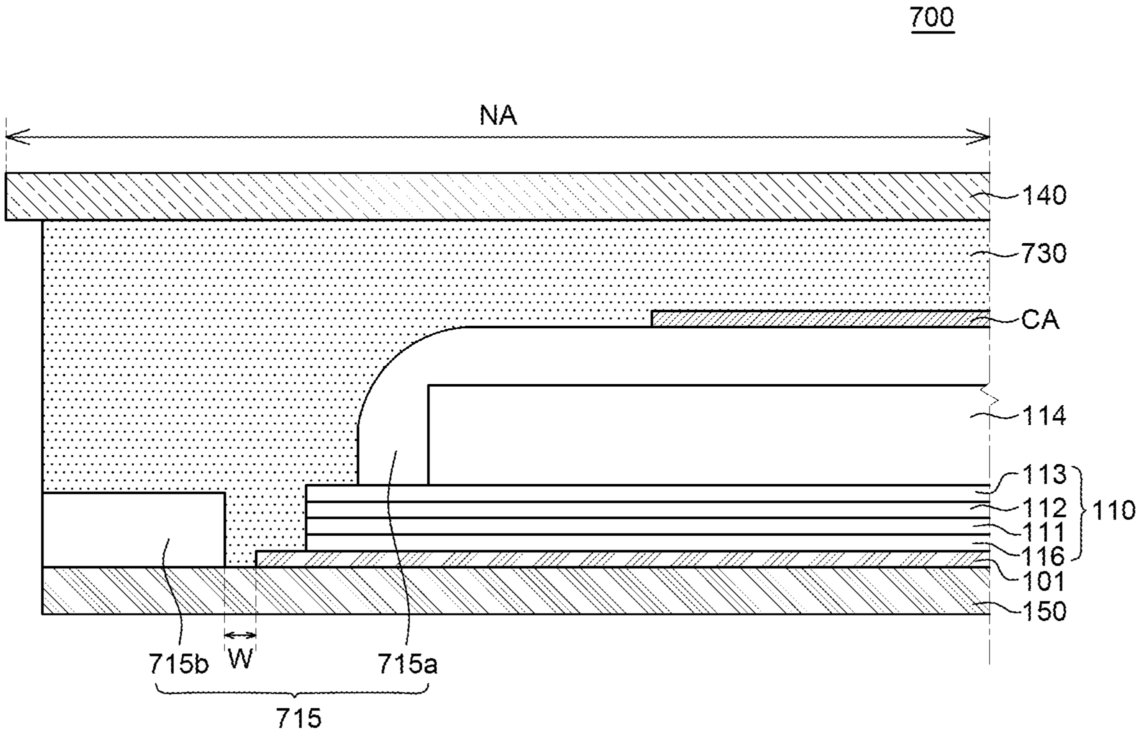
FIG. 7B is a cross-sectional view of a display device according to another example embodiment of the present disclosure.

FIG. 7A is a cross-sectional view for explaining a manufacturing process of a display device according to another example embodiment of the present disclosure. FIG. 7B is a cross-sectional view of a display device according to another example embodiment of the present disclosure. The only difference between a display device 700 of FIGS. 7A and 7B and the display device 100 of FIGS. 1 to 6A is a bank 715 and an adhesive layer 730, but the other configuration is substantially the same so that a redundant description will be omitted.

In a manufacturing process of a display device 700, referring to FIG. 7A, a bank 715 is disposed on a temporary substrate SUB, a first substrate 101, an inorganic layer 110, and a planarization layer 114.

The bank 715 includes a first bank 715*a* and a second bank 715*b*. An area of the bank 715 overlapping the first substrate 101 is referred to as the first bank 715*a* and an area which does not overlap the first substrate 101 may be referred to as the second bank 715*b*.

The first bank 715*a* and the second bank 715*b* may be disposed to be spaced apart from each other.

An end of the first bank 715*a* may be disposed at an inner side than an end of the inorganic layer 110. An end of the second bank 115*b* may be disposed to be in contact with the temporary substrate SUB in the non-active area NA. Therefore, the inorganic layer 110 and a part of a top surface of the first substrate 101 may be exposed between the first bank 715*a* and the second bank 715*b*.

The second bank 715*b* may be disposed to be spaced apart from the first substrate 101. For example, a width W of a separated space between the first substrate 101 and the second bank 715*b* may be 100 μm or less. Further, the second bank 715*b* may also be disposed to be spaced apart from the inorganic layer 110 disposed at the inside of the end of the first substrate 101.

The cathode CA, the adhesive layer 730, and the second substrate 140 may be disposed on the bank 715. The adhesive layer 730 may be formed to be filled in the separated space between the second bank 715*b* and the first substrate 101 and the inorganic layer 110. For example, the adhesive layer 730 may cover a side surface of the first bank 715*a*, and a top surface of the temporary substrate SUB, a side surface of the inorganic layer 110, and the first substrate 101 exposed by the first bank 715*a*.

Next, the first substrate 101 and the temporary substrate SUB may be separated from each other by means of the LLO process. In the area where the first substrate 101 is disposed, the sacrificial layer 102 is located between the first substrate 101 and the temporary substrate SUB so that the first substrate 101 and the temporary substrate SUB may be easily separated.

The second bank 715*b* is deformed to be crumbled or cracked during the LLO process. Therefore, a part of the temporary substrate SUB which is in contact with the second bank 715B may be easily separated during the LLO process.

When the LLO process is completed, as illustrated in FIG. 7B, the first substrate 101 and the second bank 715*b* remain. As described above, the second bank 715*b* is deformed to be crumbled or cracked during the LLO process. Therefore, a part of the second bank 715*b* which is in contact with the adhesive layer 730 remains in a state attached to the adhesive layer 730, but a part which is not in contact with the adhesive layer 730 may be removed together during the process of removing the temporary substrate SUB. That is, a part of the second bank 715*b* which is not in contact with the adhesive layer 730 is separated by an external force so that as illustrated in FIG. 7B, finally, only the second bank 715*b* which is in contact with the adhesive layer 730 remains.

During the LLO process, the temporary substrate SUB and the adhesive layer 730 may be easily separated. The temporary substrate SUB and the adhesive layer 730 are attached by an adhesiveness of the adhesive layer 730. However, as described above, when a width W of the separated space between the first substrate 101 and the second bank 715*b* is 100 μm or less, a contact area of the adhesive layer 730 and the temporary substrate SUB is very small. Therefore, the temporary substrate SUB and the adhesive layer 730 may be easily separated.

Next, the polarizer 150 is disposed below the second bank 715*b* and the first substrate 101. In the meantime, the adhesive layer 730 may be implemented to protrude between the first substrate 101 and the second bank 715*b*. For example, the adhesive layer 730 may have a protruding shape to be filled between the first substrate 101 and the second bank 715*b* and actually, protrude from bottom surfaces of the second bank 715*b* and the first substrate 101 with a thickness of several tens of nm. Therefore, the polarizer 150 may planarize the protruding shape of the adhesive layer 730.

In the display device 700 according to another example embodiment of the present disclosure, the bank 715 includes to include the second bank 715*b* disposed at an outside of the first substrate 101. Therefore, the LLO process is performed without disposing the first substrate 101 and the inorganic layer 110 at the outside of the display device 700 to improve the reliability. Further, the driving failure caused by the cracks may be also reduced.

Further, in the display device 700 according to another example embodiment of the present disclosure, a seal member disposed at the outside of the second bank 715*b* and the adhesive layer 730 is removed to reduce the bezel area.

Further, in the display device 700 according to another example embodiment of the present disclosure, the second bank 715*b* is spaced apart from the inorganic layer 110 to reduce the cracks of the inorganic layer 110 generated at the outside of the display device 700. As described above, the second bank 715*b* may be crumbled or cracked during the LLO process. At this time, the cracks may propagate to the inorganic layer by the scattering materials of the second bank. Therefore, in the display device 700 according to another example embodiment of the present disclosure, the inorganic layer 110 and the second bank 715*b* are spaced apart from each other to block the cracks or the damage of the inorganic layer 110 due to the scattering materials of the bank 715 generated during the LLO process.

Figure 8A:
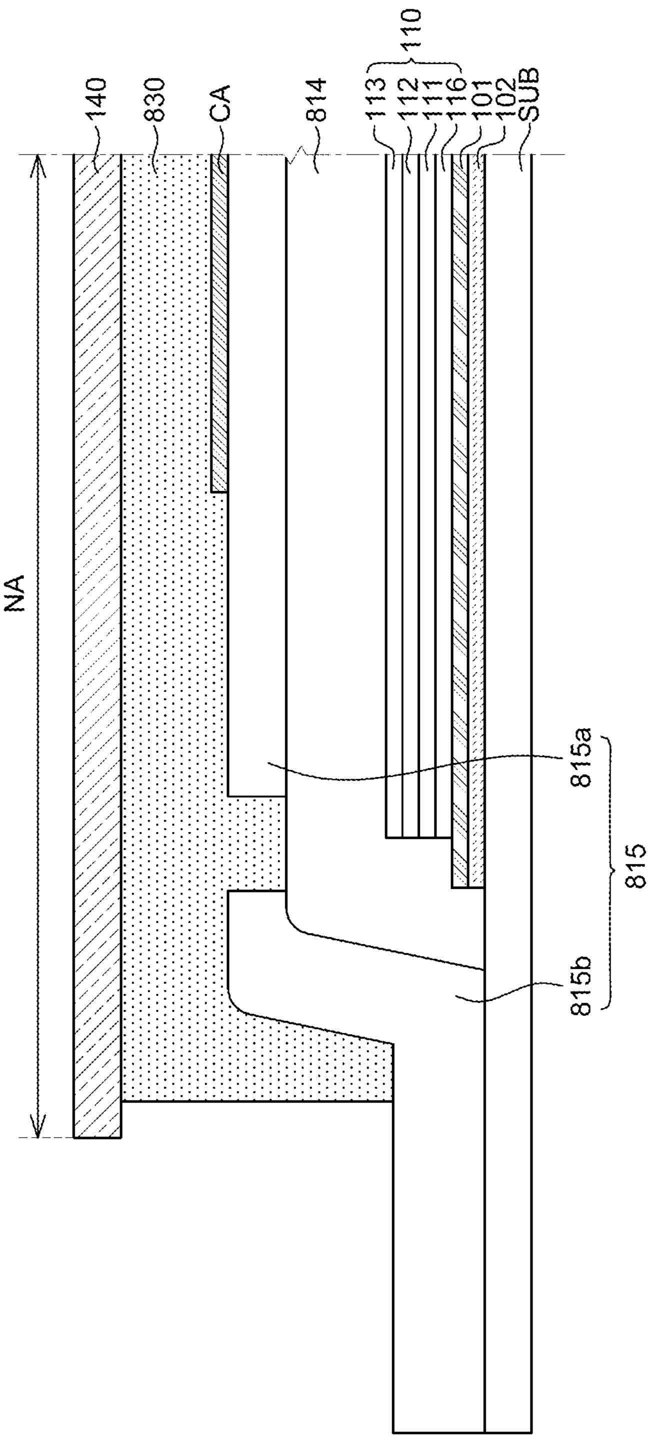
FIG. 8A is a cross-sectional view for explaining a manufacturing process of a display device according to still another example embodiment of the present disclosure.
Figure 8B:
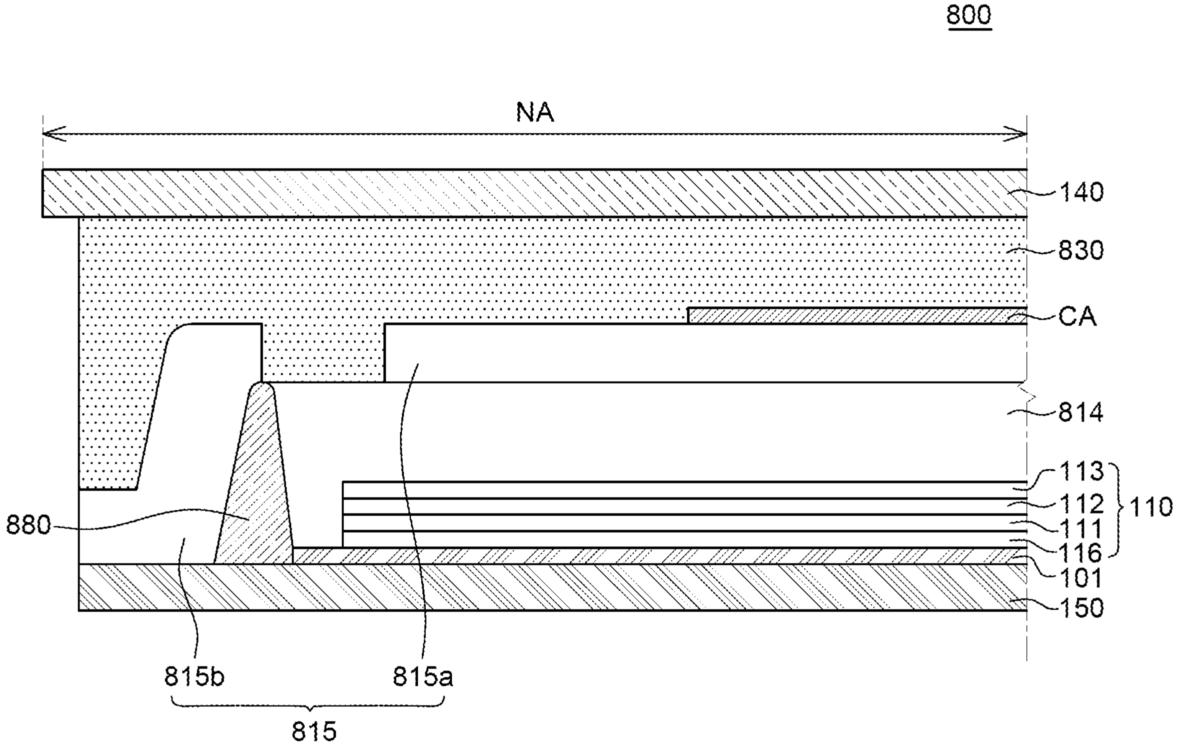
FIG. 8B is a cross-sectional view of a display device according to still another example embodiment of the present disclosure.

FIG. 8A is a cross-sectional view for explaining a manufacturing process of a display device according to still another example embodiment of the present disclosure. FIG. 8B is a cross-sectional view of a display device according to still another example embodiment of the present disclosure. The only difference between a display device 800 of FIGS. 8A and 8B and the display device 100 of FIGS. 1 to 6A is a planarization layer 814, a bank 814, and an adhesive layer 830, but the other configuration is substantially the same so that a redundant description will be omitted.

In order to describe the manufacturing process, referring to FIG. 8A, the planarization layer 814 is disposed on the temporary substrate SUB, the first substrate 101, and the inorganic layer 110.

An end of the planarization layer 814 may be located at the outer side than the end of the inorganic layer 110 and the first substrate 101 in the non-active area NA. For example, the planarization layer 814 may cover the side surface of the first substrate 101 and the inorganic layer 110 on the inorganic layer 110 and may be in contact with the temporary substrate SUB at the outside of the first substrate 101.

A bank 815 is disposed on the planarization layer 814. An area of the bank 815 which overlaps the first substrate 101 is referred to as a first bank 815*a*, and an area which does not overlap the first substrate 101 may be referred to as a second bank 815*b*.

The first bank 815*a* and the second bank 815*b* may be disposed to be spaced apart from each other.

The end of the first bank 815*a* may be disposed at the inner side than an end of the inorganic layer 110 and an end of the first substrate 101 on the planarization layer 814. For example, the first bank 815*a* may be in contact with the planarization layer 814 disposed on the inorganic layer 110 and the first substrate 101.

The second bank 815*b* may be disposed on the same layer as the first substrate 101 at the outside of the first substrate 101. Further, one end of the second bank 815*b* may be disposed on the planarization layer 814. Therefore, the second bank 815*b* may cover the end of the planarization layer 814. At this time, the second bank 815*b* may be disposed so as to be in contact with the planarization layer 814 and the temporary substrate SUB. Therefore, an end of the second bank 815*b* may be in contact with the temporary substrate SUB in the non-active area NA at the outside of the planarization layer 814 disposed in the non-active area NA.

Therefore, a part of a top surface of the planarization layer 814 may be exposed between the first bank 815*a* and the second bank 815*b*.

The cathode CA, the adhesive layer 830, and the second substrate 140 may be disposed on the bank 815. The adhesive layer 830 may be formed to be filled in a separated space between the first bank 815*a* and the second bank 815*b*.

Next, the first substrate 101 and the temporary substrate SUB may be separated by means of the LLO process. In the area where the first substrate 101 is disposed, the sacrificial layer 102 is located between the first substrate 101 and the temporary substrate SUB so that the first substrate 101 and the temporary substrate SUB may be easily separated.

The second bank 815*b* is deformed to be crumbled or cracked during the LLO process. Therefore, a part of the temporary substrate SUB which is in contact with the second bank 815*b* may be easily separated during the LLO process.

Further, when the second bank 815*b* is disposed to be in contact with the planarization layer 814 on the temporary substrate SUB, the second bank 815*b* may absorb light which passes through the temporary substrate SUB and the planarization layer 814. Therefore, an interface of the second bank 815*b* and the planarization layer 814 may be separated during the process of removing the temporary substrate SUB.

When the above-described LLO process is completed, as illustrated in FIG. 8B, the first substrate 101 and the second bank 815*b* remain. As described above, the second bank 815*b* is deformed to be crumbled or cracked during the LLO process. Therefore, a part of the second bank 815*b* which is in contact with the adhesive layer 830 remains in a state attached to the adhesive layer 830, but a part which is not in contact with the adhesive layer 830 may be removed during the process of removing the temporary substrate SUB. That is, a part of the second bank 815*b* which is not in contact with the adhesive layer 830 is separated by an external force so that as illustrated in FIG. 8B, finally, only the second bank 815*b* which is in contact with the adhesive layer 830 remains.

Next, the polarizer 150 is disposed below the second bank 815*b*, the planarization layer 814, and the first substrate 101.

Referring to FIG. 8B, the planarization layer 814 which is in contact with the temporary substrate SUB is removed during the LLO process so that as illustrated in FIG. 8B, there may be a first space 880 which is an empty space enclosed by the first substrate 101, the polarizer 150, the second bank 815*b*, and the planarization layer 814. However, it is not limited thereto and the first space 880 may be filled by an adhesive layer used for the adhesion process of the polarizer 150.

The planarization layer 814 may enclose the side surface of the inorganic layer 110 in an area overlapping the inorganic layer 110 and the first substrate 101.

The cathode CA, the adhesive layer 830, and the second substrate 140 may be disposed on the bank 815. The adhesive layer 830 may be filled in a separated space between the first bank 815*a* and the second bank 815*b*. For example, the adhesive layer 830 may cover a top surface of the planarization layer 814 exposed between the first bank 815*a* and the second bank 815*b*.

In the display device 800 according to still another example embodiment of the present disclosure, the bank 815 includes the second bank 815*b* disposed at an outside of the first substrate 101. Therefore, the LLO process is performed without disposing the first substrate 101 and the inorganic layer 110 at the outside of the display device 800 to improve the reliability. Further, the driving failure caused by the cracks may be also reduced.

Further, in the display device 800 according to still another example embodiment of the present disclosure, a seal member disposed at the outside of the second bank 815*b* and the adhesive layer 830 is removed to reduce the bezel area.

Further, in the display device 800 according to still another example embodiment of the present disclosure, the second bank 815*b* is spaced apart from the inorganic layer 110 to reduce the cracks of the inorganic layer 110 generated at the outside of the display device 800. As described above, the second bank 815*b* may be crumbled or cracked during the LLO process. At this time, the cracks may propagate to the inorganic layer by the scattering materials of the second bank. Therefore, in the display device 800 according to still another example embodiment of the present disclosure, the inorganic layer 110 and the second bank 815*b* are spaced apart from each other to block the cracks or the damage of the inorganic layer 110 due to the scattering materials of the bank 815 generated during the LLO process.

In the display device 800 according to still another example embodiment of the present disclosure, the planarization layer 814 is filled in a space exposed by the first substrate 101 and the second bank 815*b* to easily perform the LLO process. That is, when the planarization layer 814 is in contact with the temporary substrate SUB at the outside of the first substrate 101, even though a width W of the separated space between the first substrate 101 and the second bank 815*b* is not miniaturized to 100 μm or less, the temporary substrate SUB and the first substrate 101 may be easily separated. Therefore, it is not necessary to adjust a process margin for ensuring a space between the first substrate 101 and the second bank 815*b* so that the manufacturing process of the display device 800 may be more easily performed.

Figure 9A:
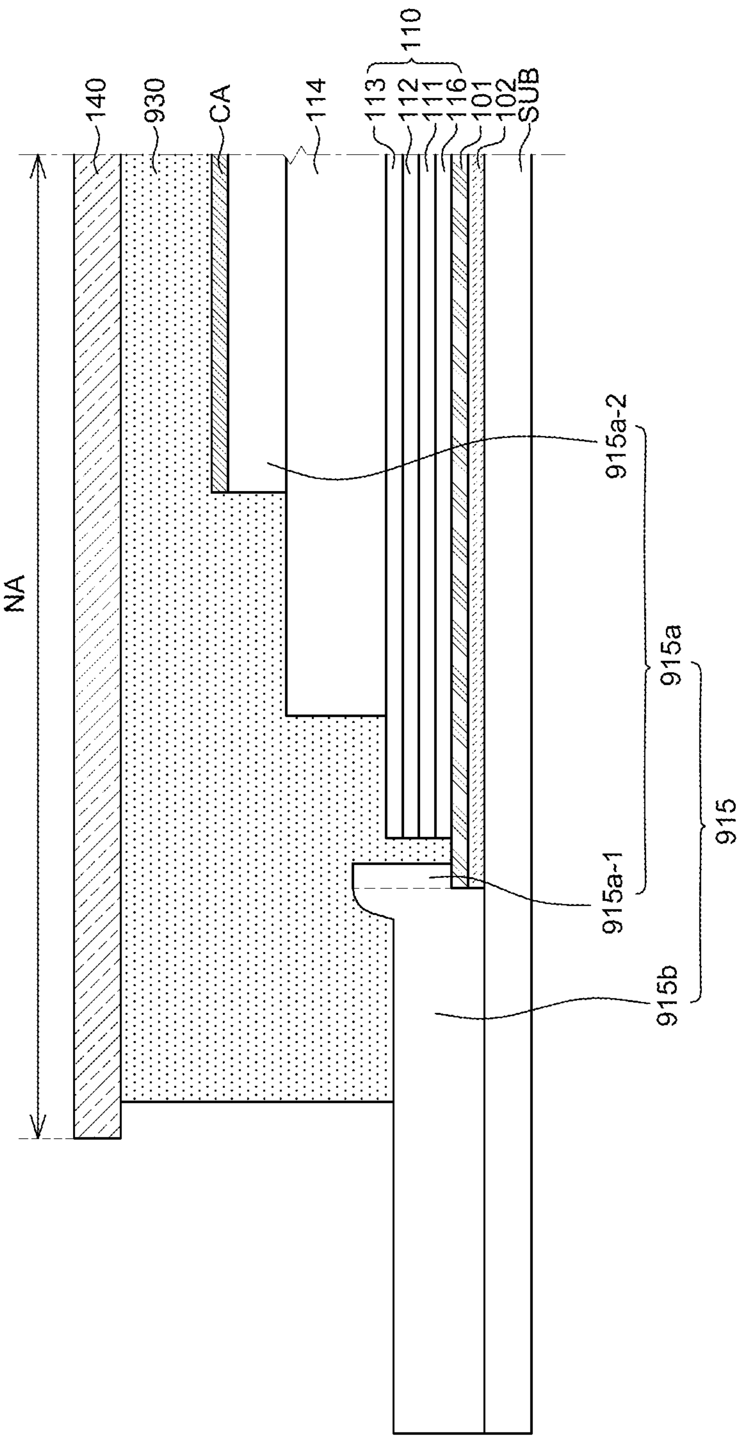
FIG. 9A is a cross-sectional view for explaining a manufacturing process of a display device according to still another example embodiment of the present disclosure.
Figure 9B:
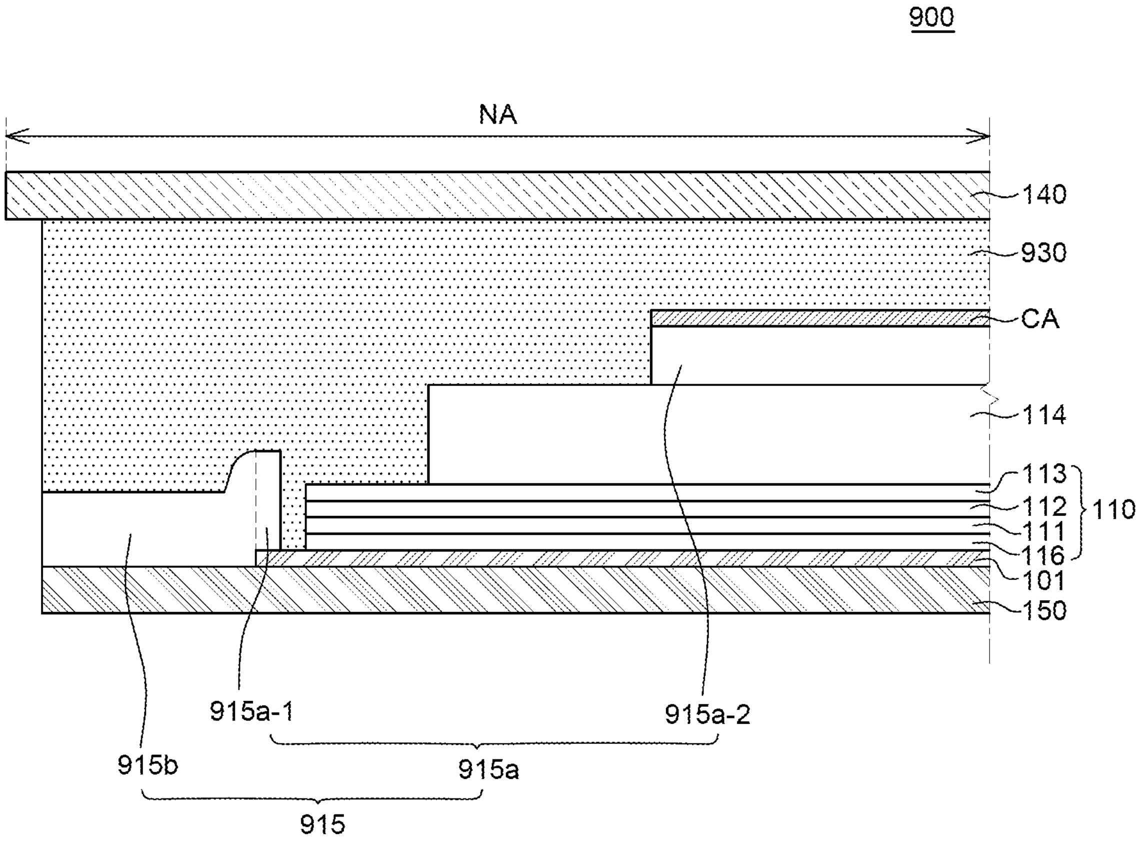
FIG. 9B is a cross-sectional view of a display device according to still another example embodiment of the present disclosure.

FIG. 9A is a cross-sectional view for explaining a manufacturing process of a display device according to still another example embodiment of the present disclosure. FIG. 9B is a cross-sectional view of a display device according to still another example embodiment of the present disclosure. The only difference between a display device 900 of FIGS. 9A and 9B and the display device 100 of FIGS. 1 to 6A is a bank 915 and an adhesive layer 930, but the other configuration is substantially the same so that a redundant description will be omitted.

In order to describe a manufacturing process, referring to FIG. 9A, a bank 915 is disposed on a temporary substrate SUB, a first substrate 101, an inorganic layer 110, and a planarization layer 141.

The bank 915 includes a first bank 915*a* and a second bank 915*b*. An area of the bank 915 which overlaps the first substrate 101 is referred to as the first bank 915*a*, and an area which does not overlap the first substrate 101 may be referred to as the second bank 915*b*.

The first bank 915*a* includes a first part 915*a*-1 connected to the second bank 915*b* and a second part 915*a*-2 which is spaced apart from the first part 915*a*-1 and is disposed to be closer to the active area AA than the first part 915*a*-1.

The first part 915*a*-1 of the first bank 915 may be disposed on the first substrate 101 exposed by the inorganic layer 110. That is, the first part 915*a*-1 may cover the end of the first substrate 101. Further, the first part 915*a*-1 may be disposed to be spaced apart from the planarization layer 114. At this time, when an end of the inorganic layer 110 protrudes to the outside from an end of the planarization layer 114, the first part 915*a*-1 may be disposed to be spaced apart from the inorganic layer 110.

The second part 915*a*-2 of the first bank 915 may be disposed in an area overlapping the first substrate 101. At this time, the end of the second part 915*a*-2 may be disposed between an end of the cathode CA and the end of the planarization layer 114. As illustrated in FIGS. 9A and 9B, the second part 915*a*-2 may be disposed in an area overlapping the cathode CA.

The second bank 915*b* may be disposed so as to be in contact with the temporary substrate SUB. At this time, the second bank 915*b* may be disposed to be connected to the first part 915*a*-1 disposed on the first substrate 101.

The cathode CA, the adhesive layer 930, and the second substrate 140 may be disposed on the bank 915. The adhesive layer 930 may be formed to be filled in a separated space between the first part 915*a*-1 and the inorganic layer 110.

Next, the first substrate 101 and the temporary substrate SUB may be separated by means of the LLO process. In the area where the first substrate 101 is disposed, the sacrificial layer 102 is located between the first substrate 101 and the temporary substrate SUB so that the first substrate 101 and the temporary substrate SUB may be easily separated.

The second bank 915*b* is deformed to be crumbled or cracked during the LLO process. Therefore, a part of the temporary substrate SUB which is in contact with the second bank 915*b* may be easily separated during the LLO process.

When the LLO process is completed, as illustrated in FIG. 9B, the first substrate 101 and the second bank 915*b* remain. As described above, the second bank 915*b* is deformed to be crumbled or cracked during the LLO process. Therefore, a part of the second bank 915*b* which is in contact with the adhesive layer 930 remains in a state attached to the adhesive layer 930, but a part which is not in contact with the adhesive layer 930 may be removed together during the process of removing the temporary substrate SUB. That is, a part of the second bank 915*b* which is not in contact with the adhesive layer 930 is separated by an external force so that as illustrated in FIG. 9B, finally, only the second bank 915*b* which is in contact with the adhesive layer 930 remains.

Next, the polarizer 150 is disposed below the second bank 915*b* and the first substrate 101.

In the display device 900 according to still another example embodiment of the present disclosure, the bank 915 includes a second bank **915*b* disposed at an outside of the first substrate 101. Therefore, the LLO process is performed without disposing the first substrate 101 and the inorganic layer 110 at the outside of the display device 900** to improve the reliability. Further, the driving failure caused by the cracks may be also reduced.

Further, in the display device 900 according to still another example embodiment of the present disclosure, a seal member disposed at the outside of the second bank **915*b* and the adhesive layer 930** is removed to reduce the bezel area.

Further, in the display device 900 according to still another example embodiment of the present disclosure, the second bank **915*b* is spaced apart from the inorganic layer 110 to reduce the cracks of the inorganic layer 110 generated at the outside of the display device 900. As described above, the second bank 915*b* may be crumbled or cracked during the LLO process. At this time, the cracks may propagate to the inorganic layer by the scattering materials of the second bank. Therefore, in the display device 900 according to still another example embodiment of the present disclosure, the inorganic layer 110 and the second bank 915*b* are spaced apart to block the cracks or the damage of the inorganic layer 110 due to the scattering material of the bank 915** generated during the LLO process.

Further, in the display device 900 according to another example embodiment of the present disclosure, the bank 915 is disposed so as to cover the end of the first substrate 101 to easily perform the LLO process. Referring to FIG. 9A, a top surface of the temporary substrate SUB is in contact with only the sacrificial layer 102 and the bank 915, but is not in contact with the other organic layer or adhesive layer. Therefore, during the LLO process, the temporary substrate SUB is easily separated from the first substrate 101 in an area where the first substrate 101 and the sacrificial layer 102 are disposed and may be easily separated from the second bank **915*b* in an area where the second bank 915 is disposed. Therefore, in the display device 900 according to still another example embodiment of the present disclosure, the LLO process may be easily performed by disposing the first substrate 101 and the bank 915** and a tearing failure of the other component may not be caused.

Figure 10A:
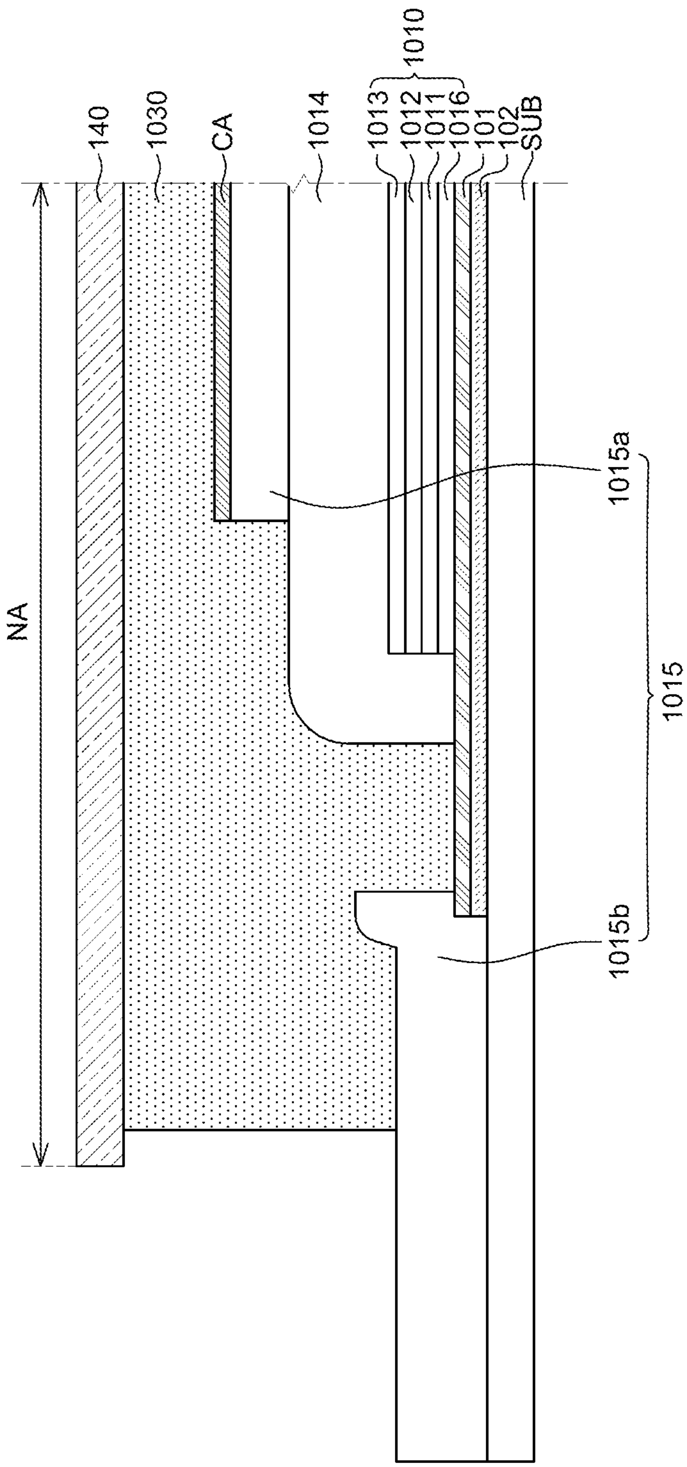
FIG. 10A is a cross-sectional view for explaining a manufacturing process of a display device according to still another example embodiment of the present disclosure.
Figure 10B:
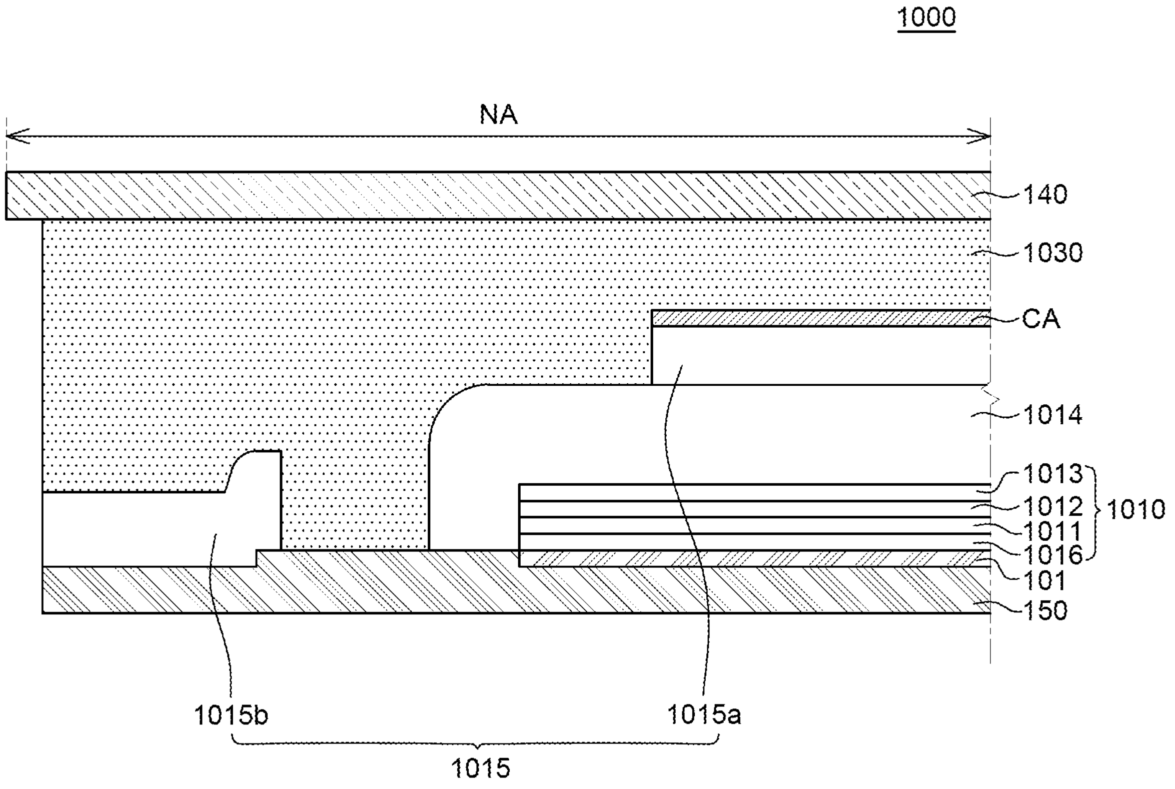
FIG. 10B is a cross-sectional view of a display device according to still another example embodiment of the present disclosure.

FIG. 10A is a cross-sectional view for explaining a manufacturing process of a display device according to still another example embodiment of the present disclosure. FIG. 10B is a cross-sectional view of a display device according to still another example embodiment of the present disclosure. The only difference between a display device 1000 of FIGS. 10A and 10B and the display device 900 of FIGS. 9A and 9B is a bank 1015, an inorganic layer 1010, a planarization layer 1014, and an adhesive layer 1030, but the other configuration is substantially the same so that a redundant description will be omitted.

In order to describe the manufacturing process, referring to FIG. 10A, an inorganic layer 1010 is disposed on the temporary substrate SUB and the first substrate 101.

In order to increase an exposed area of the first substrate 101, the inorganic layer 1010 may be disposed to be close to an end of the cathode CA disposed in the non-active area NA.

The planarization layer 1014 is disposed on the inorganic layer 1010. The planarization layer 1014 may be disposed to cover an end of the inorganic layer 1010. The planarization layer 1014 may be disposed so as to overlap a top surface of the inorganic layer 1010 and a part of the first substrate 101 exposed by the inorganic layer 1010. Therefore, the planarization layer 1014 may be disposed so as to enclose the top surface and a side surface of the inorganic layer 1010 while sealing the inorganic layer 1010.

A bank 1015 is disposed on the planarization layer 1014. The bank 1015 includes a first bank **1015*a* and a second bank 1015*b*. The first bank 1015*a* may be disposed in an area overlapping the first substrate 101. At this time, the end of the first bank 1015*a* may be disposed between an end of the cathode CA and the end of the planarization layer 1014. As illustrated in FIGS. 10A and 10B, the first bank 1015*a*** may be disposed in an area overlapping the cathode CA.

The second bank **1015*b* may be disposed so as to be in contact with the temporary substrate SUB. At this time, the second bank 1015*b* may be disposed on the first substrate 101 exposed by the inorganic layer 1010. That is, the second bank 1015*b* may cover the end of the first substrate 101. Further, the second bank 1015*b* may be disposed to be spaced apart from the planarization layer 1014. For example, one surface of the temporary substrate SUB may be exposed between the planarization layer 1014 and the second bank 1015*b***.

The cathode CA, the adhesive layer 1030, and the second substrate 140 may be disposed on the bank 1015.

The adhesive layer 1030 may be formed to be filled in a separated space between the second bank **1015*b* and the planarization layer 1014. For example, the adhesive layer 1030 may cover a side surface of the second bank 1015*b*, a side surface of the planarization layer 1014, and a top surface of the temporary substrate SUB exposed by the second bank 1015*b* and the planarization layer 1014**.

Next, the first substrate 101 and the temporary substrate SUB may be separated by means of the LLO process. In the area where the first substrate 101 is disposed, the first substrate 101 is removed together with the temporary substrate SUB from the area where the adhesive layer 1030, the planarization layer 1014, and the second bank **1015*b* are in contact with the first substrate 101. In the remaining area, the first substrate 101** and the temporary substrate SUB may be easily separated.

The second bank **1015*b* is deformed to be crumbled or cracked during the LLO process. Therefore, a part of the temporary substrate SUB which is in contact with the second bank 1015*b*** may be easily separated during the LLO process.

Next, the polarizer 150 is disposed below the second bank **1015*b* and the first substrate 101**.

Referring to FIG. 10B, the polarizer 150 is disposed below the first substrate 101. At this time, in FIG. 10B, it is illustrated that the polarizer 150 is disposed to protrude toward the adhesive layer 1030, but it not limited thereto and an area from which the first substrate 101 is removed may be filled by an adhesive which bonds the first substrate 101 and the polarizer 150.

In the display device 1000 according to still another example embodiment of the present disclosure, the bank 1015 includes a second bank **1015*b* disposed at an outside of the first substrate 101. Therefore, the LLO process is performed without disposing the first substrate 101 and the inorganic layer 1010 at the outside of the display device 1000** to improve the reliability. Further, the driving failure caused by the cracks may be also reduced.

Further, in the display device 1000 according to still another example embodiment of the present disclosure, a seal member disposed at the outside of the second bank **1015*b* and the adhesive layer 1030** is removed to reduce the bezel area.

Further, in the display device 1000 according to still another example embodiment of the present disclosure, the second bank 1015*b* is spaced apart from the inorganic layer 1010 to reduce the cracks of the inorganic layer 1010 generated at the outside of the display device 1000. As described above, the second bank 1015 may be crumbled or cracked during the LLO process. At this time, the cracks may propagate to the inorganic layer by the scattering materials of the second bank. Therefore, in the display device 1000 according to still another example embodiment of the present disclosure, the inorganic layer 1010 and the second bank 1015*b* are spaced apart to block the cracks or the damage of the inorganic layer 1010 due to the scattering material of the bank 1015 generated during the LLO process.

Specifically, in the display device 1000 according to still another example embodiment of the present disclosure, the planarization layer 1014 is disposed so as to cover an end of the inorganic layer 1010 to reduce the damage of the inorganic layer 1010. Even though the second bank is spaced apart from the inorganic layer at the outside of the display device, the cracks may propagate to the inorganic layer. Therefore, in the display device 1000 according to still another example embodiment of the present disclosure, the planarization layer 1014 is disposed so as to cover an end of the inorganic layer 1010 at the outside of the display device 1000. Therefore, it is possible to efficiently protect the inorganic layer from the external impact or the scattering material of the bank 1015.

Figure 11A:
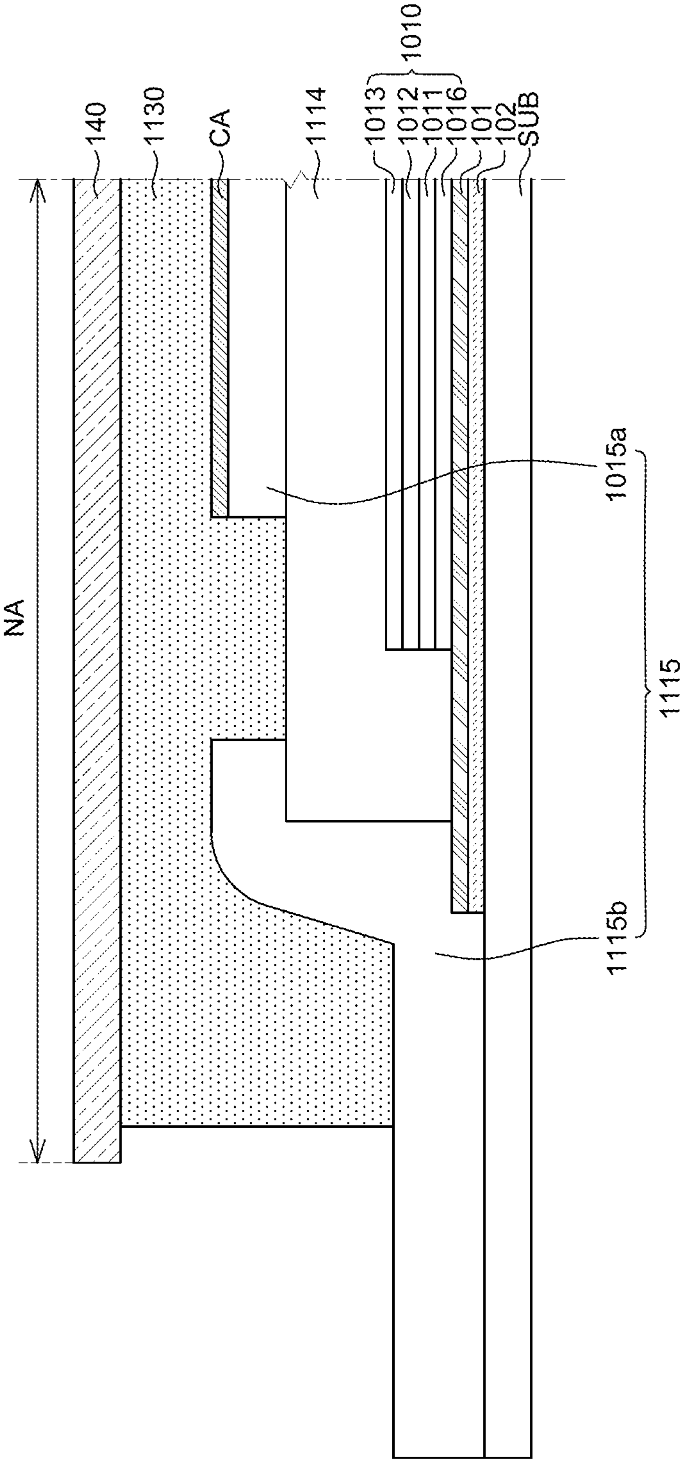
FIG. 11A is a cross-sectional view for explaining a manufacturing process of a display device according to still another example embodiment of the present disclosure.
Figure 11B:
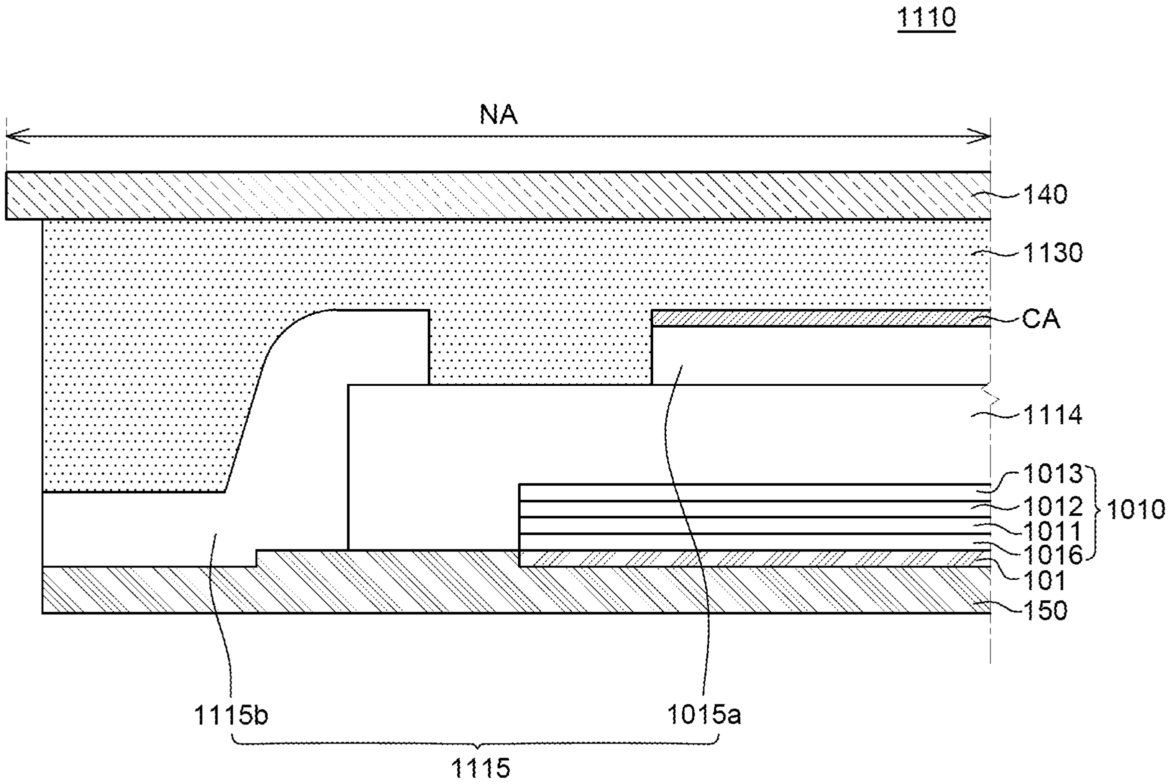
FIG. 11B is a cross-sectional view of a display device according to still another example embodiment of the present disclosure.

FIG. 11A is a cross-sectional view for explaining a manufacturing process of a display device according to still another example embodiment of the present disclosure. FIG. 11B is a cross-sectional view of a display device according to still another example embodiment of the present disclosure. The only difference between a display device 1100 of FIGS. 11A and 11B and the display device 1000 of FIGS. 10A and 10B is a planarization layer 1114, a second bank 1115*b*, and an adhesive layer 1130, but the other configuration is substantially the same so that a redundant description will be omitted.

In order to describe the manufacturing process, referring to FIG. 11A, the planarization layer 1114 is disposed on the temporary substrate SUB, the first substrate 101, and the inorganic layer 1010.

The planarization layer 1114 may be disposed to cover an end of the inorganic layer 1010. Therefore, the planarization layer 1114 may be disposed so as to overlap a top surface of the inorganic layer 1010 and a part of the first substrate exposed by the inorganic layer 1010. Therefore, the planarization layer 1114 may be disposed so as to enclose the top surface and the side surface of the inorganic layer 1010 while sealing the inorganic layer 1010.

A bank 1115 is disposed on the planarization layer 1114. The bank 1115 includes a first bank 1015*a* and a second bank 1115*b*.

The first bank 1015*a* may be disposed in an area overlapping the first substrate 101.

The second bank 1115*b* may be disposed so as to be in contact with the temporary substrate SUB. At this time, the second bank 1115*b* may be disposed on the first substrate 101 exposed by the inorganic layer 1010. That is, the second bank 1115*b* may cover the end of the first substrate 101. The second bank 1115*b* may be in contact with a side surface of the planarization layer 1114 and one end of the second bank 1115*b* may be disposed on the first substrate 101 and the planarization layer 1114 exposed by the inorganic layer 1010.

Further, the second bank 1115*b* may be disposed to be spaced apart from the first bank 1015*a*. For example, the bank 1115 may be formed so as to expose a part of a top surface of the planarization layer 1114 between the first bank 1015*a* and the second bank 1115*b*. The cathode CA, the adhesive layer 1130, and the second substrate 140 may be disposed on the bank 1115.

The adhesive layer 1130 may be formed to be filled in a separated space between the first bank 1015*a* and the second bank 1115*b*. Therefore, the adhesive layer 1130 may be in contact with one surface of the planarization layer 1115 exposed between the first bank 1015*a* and the second bank 1115*b*.

Next, the first substrate 101 and the temporary substrate SUB may be separated by means of the LLO process. In the area where the first substrate 101 is disposed, the first substrate 101 is removed together with the temporary substrate SUB from an area where the planarization layer 1114 and the second bank 1115*b* are in contact with the first substrate 101. In the remaining area, the first substrate 101 and the temporary substrate SUB may be easily separated.

The second bank 1115*b* is deformed to be crumbled or cracked during the LLO process. Therefore, a part of the temporary substrate SUB which is in contact with the second bank 1115*b* may be easily separated during the LLO process.

Next, the polarizer 150 is disposed below the second bank 1115*b* and the first substrate 101.

Referring to FIG. 11B, the polarizer 150 is disposed below the first substrate 101. In FIG. 11B, it is illustrated that the polarizer 150 is disposed to protrude toward the second bank 1115*b* and the planarization layer 1114, but it not limited thereto and an area from which the first substrate 101 is removed may be filled by an adhesive which bonds the first substrate 101 and the polarizer 150.

In the display device 1100 according to still another example embodiment of the present disclosure, the bank 1115 includes the second bank 1115*b* disposed at an outside of the first substrate 101. Therefore, the LLO process is performed without disposing the first substrate 101 and the inorganic layer 1010 at the outside of the display device 1000 to improve the reliability. Further, the driving failure caused by the cracks is also reduced.

Further, in the display device 1100 according to still another example embodiment of the present disclosure, a seal member disposed at the outside of the second bank 1115*b* and the adhesive layer 1130 is removed to reduce the bezel area.

Further, in the display device 1100 according to still another example embodiment of the present disclosure, the second bank 1115*b* is spaced apart from the inorganic layer 1010 to reduce the cracks of the inorganic layer 1010 generated at the outside of the display device 1100. As described above, the second bank 1115*b* may be crumbled or cracked during the LLO process. At this time, the cracks may propagate to the inorganic layer by the scattering materials of the second bank. Therefore, in the display device 1100 according to still another example embodiment of the present disclosure, the inorganic layer 1010 and the second bank 1115*b* are spaced apart to block the cracks or the damage of the inorganic layer 1010 due to the scattering material of the bank 1115 generated during the LLO process.

Specifically, in the display device 1100 according to still another example embodiment of the present disclosure, the planarization layer 1114 is disposed so as to cover an end of the inorganic layer 1010 to reduce the damage of the inorganic layer 1010. Even though the second bank is spaced apart from the inorganic layer at the outside of the display device, the cracks may also propagate to the inorganic layer. Therefore, in the display device 1100 according to still another example embodiment of the present disclosure, the planarization layer 1114 is disposed so as to cover an end of the inorganic layer 1010 at the outside of the display device 1100. Therefore, it is possible to efficiently protect the inorganic layer 1010 from the external impact or the scattering material of the bank 1115.

Further, in the display device 1100 according to still another example embodiment of the present disclosure, the planarization layer 1114, rather than the adhesive layer 1130, is disposed to be in contact with the first substrate 101 to easily perform the LLO process.

The example embodiments of the present disclosure can also be described as follows:

According to an aspect of the present disclosure, there is provided a display device. The display device comprises a first substrate which includes an active area including a plurality of sub pixels and a non-active area enclosing, or in some embodiments, adjacent to the active area and is formed of one of transparent conducting oxide and an oxide semiconductor, an inorganic layer disposed on the first substrate, a planarization layer disposed on the inorganic layer, a bank disposed on the planarization layer, an adhesive layer disposed on the inorganic layer, the planarization layer, and the bank, and a second substrate disposed on the adhesive layer, wherein the bank includes a first bank disposed in an area overlapping the first substrate and a second bank disposed to enclose a side surface of the first bank.

The second bank may be disposed so as to enclose the inorganic layer, the planarization layer, and the side surface of the first substrate.

The second bank may be disposed on the same layer as the first substrate at an outside of the first substrate.

The display device may further comprise a flexible film disposed at one side of the non-active area on the first substrate, wherein the second bank may be disposed in the non-active area at a side portion excluding the one side in which the first flexible film is disposed.

An end of the second bank may be located on the same plane as an end of the adhesive layer or located at an inside from the end of the adhesive layer.

The first bank and the second bank may have different densities.

The second bank may include a cracked portion.

The second bank may be in a state in which crumbled powders are gathered.

The first bank and the second bank may be integrally formed.

The first bank and the second bank may be disposed to be spaced apart from each other.

The second bank may be spaced apart from the first substrate and the inorganic layer and the adhesive layer may be filled in a separated space between the second bank and the first substrate and the inorganic layer.

A width of the separated space between the first substrate and the second bank may be 100 μm or less.

One end of the second bank may be disposed on the planarization layer, the adhesive layer may be filled in the separated space between the first bank and the second bank, and the first substrate and the second bank may be spaced apart from each other.

The planarization layer may cover an end of the inorganic layer and be disposed to be spaced apart from the second bank.

The adhesive layer may be filled in a separated space between the second bank and the planarization layer.

The first bank may include a first part connected to the second bank and a second part which may be spaced apart from the first part and be disposed to be closer to the active area than the first part.

The first part may be spaced apart from the inorganic layer, the adhesive layer may be filled in a separated space between the first part and the inorganic layer, and an end of the inorganic layer may protrude at the outside from the end of the planarization layer.

The planarization layer may be configured by an acrylic material and the bank may be formed of polyimide.

An end of the first substrate and an end of the inorganic layer may be disposed at the inside from the end of the second substrate.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:

a first substrate, which includes an active area including a plurality of sub pixels and a non-active area adjacent to the active area;

an inorganic layer disposed on the first substrate;

a planarization layer disposed on the inorganic layer;

a bank disposed on the planarization layer;

an adhesive layer disposed on the inorganic layer, the planarization layer, and the bank; and a second substrate disposed on the adhesive layer, wherein the bank includes a first bank disposed in an area overlapping the first substrate and a second bank that encloses a side surface of the first bank, and wherein the second bank encloses the inorganic layer, the planarization layer, and a side surface of the first substrate.

2. The display device according to claim 1, wherein the second bank is disposed on a same level as the first substrate and laterally outside of the first substrate.

3. The display device according to claim 1, further comprising:

a flexible film disposed at a side of the non-active area on the first substrate, wherein the second bank is disposed in the non-active area at a side portion excluding the side at which the first flexible film is disposed.

4. The display device according to claim 1, wherein an end of the second bank is located on a same plane as an end of the adhesive layer or located inside with respect to the end of the adhesive layer.

5. The display device according to claim 1, wherein the first bank and the second bank have different densities.

6. The display device according to claim 1, wherein the second bank includes a cracked portion.

7. The display device according to claim 1, wherein the second bank is in a state in which crumbled powders are gathered.

8. The display device according to claim 1, wherein the first bank and the second bank are integrally formed.

9. The display device according to claim 1, wherein the first bank and the second bank are spaced apart from each other.

10. The display device according to claim 9, wherein the second bank is spaced apart from the first substrate and the inorganic layer and the adhesive layer is between the second bank and one or more of the first substrate or the inorganic layer.

11. The display device according to claim 10, wherein a distance between the first substrate and the second bank is 100 μm or less.

12. The display device according to claim 9, wherein one end of the second bank is disposed on the planarization layer, the first bank and the second bank are separated from each other and the adhesive layer is between the first bank and the second bank, and the first substrate and the second bank are spaced apart from each other.

13. The display device according to claim 9, wherein the planarization layer covers an end of the inorganic layer and is spaced apart from the second bank.

14. The display device according to claim 9, wherein the second bank and the planarization layer are separated from each other and the adhesive layer is between the second bank and the planarization layer.

15. The display device according to claim 1, wherein the first bank includes a first part connected to the second bank and a second part, the second part spaced apart from the first part and closer to the active area than the first part.

16. The display device according to claim 15, wherein the first part is spaced apart from the inorganic layer, the adhesive layer is between the first part and the inorganic layer, and an end of the inorganic layer protrudes beyond an end of the planarization layer.

17. The display device according to claim 1, wherein the planarization layer includes an acrylic material and the bank includes a polyimide.

18. A display device, comprising:

a first substrate, which includes an active area including a plurality of sub pixels and a non-active area adjacent to the active area;

an inorganic layer disposed on the first substrate;

a planarization layer disposed on the inorganic layer;

a bank disposed on the planarization layer;

an adhesive layer disposed on the inorganic layer, the planarization layer, and the bank; and a second substrate disposed on the adhesive layer, wherein the bank includes a first bank disposed in an area overlapping the first substrate and a second bank that encloses a side surface of the first bank, and wherein the second bank is disposed on a same level as the first substrate and laterally outside of the first substrate.

19. The display device according to claim 18, wherein the second bank is spaced apart from the first substrate and the inorganic layer and the adhesive layer is between the second bank and one or more of the first substrate or the inorganic layer.

20. A display device, comprising:

a first substrate, which includes an active area including a plurality of sub pixels and a non-active area adjacent to the active area;

an inorganic layer disposed on the first substrate;

a planarization layer disposed on the inorganic layer;

a bank disposed on the planarization layer;

an adhesive layer disposed on the inorganic layer, the planarization layer, and the bank; and a second substrate disposed on the adhesive layer, wherein the bank includes a first bank disposed in an area overlapping the first substrate and a second bank that encloses a side surface of the first bank, and wherein the second bank is spaced apart from the first substrate and the inorganic layer and the adhesive layer is between the second bank and one or more of the first substrate or the inorganic layer.

* * * * *